United States Patent
Tsutsumi

(10) Patent No.: US 9,880,468 B2
(45) Date of Patent: Jan. 30, 2018

(54) RADIATION-SENSITIVE RESIN COMPOSITION AND ELECTRONIC DEVICE

(71) Applicant: ZEON CORPORATION, Tokyo (JP)

(72) Inventor: Takashi Tsutsumi, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 15/124,197

(22) PCT Filed: Mar. 18, 2015

(86) PCT No.: PCT/JP2015/058044
§ 371 (c)(1),
(2) Date: Sep. 7, 2016

(87) PCT Pub. No.: WO2015/141719
PCT Pub. Date: Sep. 24, 2015

(65) Prior Publication Data
US 2017/0017155 A1    Jan. 19, 2017

(30) Foreign Application Priority Data

Mar. 20, 2014   (JP) .................. 2014-058526

(51) Int. Cl.
| G03F 7/075 | (2006.01) |
| G03F 7/004 | (2006.01) |
| G03F 7/023 | (2006.01) |
| G03F 7/022 | (2006.01) |
| G03F 7/038 | (2006.01) |
| G03F 7/16 | (2006.01) |
| G03F 7/20 | (2006.01) |
| G03F 7/26 | (2006.01) |

(52) U.S. Cl.
CPC .......... *G03F 7/0751* (2013.01); *G03F 7/0226* (2013.01); *G03F 7/0233* (2013.01); *G03F 7/038* (2013.01); *G03F 7/0755* (2013.01); *G03F 7/16* (2013.01); *G03F 7/20* (2013.01); *G03F 7/26* (2013.01)

(58) Field of Classification Search
None
See application file for complete search history.

(56) References Cited

U.S. PATENT DOCUMENTS

| 2010/0099041 A1* | 4/2010 | Fujita .................... C08F 290/06 430/270.1 |
| 2011/0204528 A1 | 8/2011 | Matsutani et al. |
| 2012/0251949 A1 | 10/2012 | Miyabe et al. |
| 2012/0308838 A1 | 12/2012 | Ito et al. |

FOREIGN PATENT DOCUMENTS

| EP | 2110708 A1 | 10/2009 |
| JP | 5-34920 A | 2/1993 |
| JP | 2007-78796 A | 3/2007 |
| JP | 2008-83124 A | 4/2008 |
| JP | 2011-164270 A | 8/2011 |
| JP | 2013-190696 A | 9/2013 |
| JP | 2013-217954 A | 10/2013 |
| JP | 2014-170080 A | 9/2014 |
| JP | 5613851 B1 | 10/2014 |
| JP | 2015-52770 A | 3/2015 |
| WO | 2010/026988 A1 | 3/2010 |
| WO | 2011/040324 A1 | 4/2011 |
| WO | 2011/080992 A1 | 7/2011 |
| WO | 2014/087957 A1 | 6/2014 |

OTHER PUBLICATIONS

CAS Registry No. 3068-76-6, "KBM 573" tradename from SciFinder Database, downloaed Feb. 2017,2 pages added enlarged Other names to down load for easy reading.*
English translation of JP, 2008-083124 A (2008) from machine translation from AIPN Japan Patent Office National Center for Industrial Property Information and Training , generated May 27, 2017, 39 pages.*
English translation of JP, 05-034920 A (1993) from machine translation from AIPN Japan Patent Office National Center for Industrial Property Information and Training , generated May 27, 2017, 8 pages.*
English translation of International Preliminary Report dated Sep. 20, 2016, issued in International Application No. PCT/JP2015/058044 (7 pages).
International Search Report dated Jun. 2, 2015, issued in counterpart International Application No. PCT/JP2015/058044 (3 pages).
Extended European Search Report dated Sep. 19, 2017, issued in Application No. 15765304.9 (PCT/JP2015058044).

* cited by examiner

*Primary Examiner* — Cynthia Hamilton
(74) *Attorney, Agent, or Firm* — Westerman, Hattori, Daniels & Adrian, LLP

(57) ABSTRACT

A radiation-sensitive resin composition comprising a binder resin (A), radiation-sensitive compound (B), cross-linking agent (C), and silane coupling agent (D) represented by the following general formula (1) is provided. In the general formula (1), R1 to R3 respectively independently are a monovalent alkyl group having 1 to 5 carbon atoms. R4 is a divalent alkylene group having 1 to 10 carbon atoms, R5 is a hydrogen atom or monovalent alkyl group having 1 to 5 carbon atoms, and R6 to R10 are a hydrogen atom or monovalent alkyl group having 1 to 5 carbon atoms.

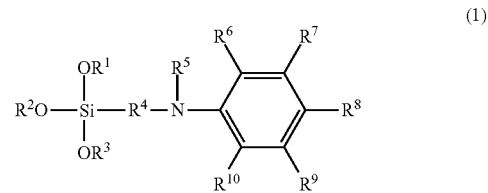

(1)

8 Claims, No Drawings

RADIATION-SENSITIVE RESIN COMPOSITION AND ELECTRONIC DEVICE

TECHNICAL FIELD

The present invention relates to a radiation-sensitive resin composition and an electronic device provided with a resin film comprised of this radiation-sensitive resin composition, more particularly relates to a radiation-sensitive resin composition which is excellent in storage stability and can give a resin film excellent in adhesion in development and low hygroscopicity and an electronic device provided with a resin film comprised of this radiation-sensitive resin composition.

BACKGROUND ART

Various display devices such as organic EL devices and liquid crystal display devices and electronic devices such as integrated circuit devices, solid imaging devices, color filters, and black matrices are provided with various resin films such as surface protective films for preventing deterioration or damage, flattening films for flattening the device surfaces, electrical insulating films for maintaining electrical insulation, and insulating films used in redistribution layers (RDL) formed on surface protective films.

In the past, as the resin materials for forming these resin films, thermosetting resin material such as epoxy resin and polyimide has been generally used. In recent years, along with the increasing density of interconnects and devices, for these resin materials as well, development of new resin material excellent in electrical characteristics such as low dielectric constant, development characteristics for forming fine patterns, and moisture resistance for higher reliability has been sought.

To meet with these demands, for example, Patent Document 1 discloses a photosensitive resin composition containing (A) a cyclic olefin-based resin having an acidic group, (B) a photo acid generator, (C) a compound having a reactive group able to bond with the acidic group of (A) at a temperature of 130° C. or more, and (D) a silane coupling agent having a sulfur atom in its molecule. However, according to the radiation-sensitive resin composition described in this Patent Document 1, while it is possible to form a resin film excellent in electrical characteristics such as a low dielectric constant, when forming fine patterns by development, the patternability is not necessarily good. Therefore, there is the problem that use for application of resin films of interconnect layers formed in fine patterns such as redistribution layers formed on surface protective films is not possible.

RELATED ART

Patent Documents

Patent Document 1: Japanese Patent Publication No. 2007-78796A

SUMMARY OF THE INVENTION

Problem to be Solved by the Invention

The present invention has as its object the provision of a radiation-sensitive resin composition excellent in storage stability and able to give a resin film excellent in adhesion in development and low hygroscopicity and an electronic device equipped with such a radiation-sensitive resin composition.

Means for Solving the Problem

The inventors engaged in intensive studies to achieve the above object and as a result discovered that by mixing together a cross-linking agent and specific silane coupling agent with a binder resin and radiation-sensitive compound, it is possible to achieve the above object and thereby completed the present invention.

That is, according to the present invention, there are provided:

[1] A radiation-sensitive resin composition comprising a binder resin (A), radiation-sensitive compound (B), cross-linking agent (C), and silane coupling agent (D) represented by the following general formula (1):

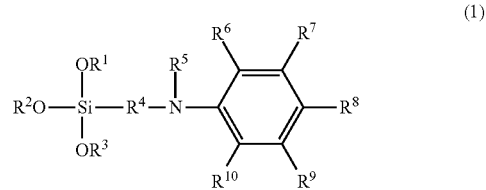

where in the general formula (1), $R^1$ to $R^3$ respectively independently are a monovalent alkyl group having 1 to 5 carbon atoms, $R^4$ is a divalent alkylene group having 1 to 10 carbon atoms, $R^5$ is a hydrogen atom or monovalent alkyl group having 1 to 5 carbon atoms, and $R^6$ to $R^{10}$ are a hydrogen atom or monovalent alkyl group having 1 to 5 carbon atoms.

[2] The radiation-sensitive resin composition according to [1] wherein the binder resin (A) is a cyclic olefin polymer having a protonic polar group,

[3] The radiation-sensitive resin composition according to [1] or [2] wherein the cross-linking agent (C) includes an epoxy compound having an epoxy group,

[4] The radiation-sensitive resin composition according to [3] wherein the total amount of chlorine of the epoxy compound is 1500 ppm or less,

[5] The radiation-sensitive resin composition according to [3] or [4] wherein the cross-linking agent (C) further includes a compound having an alkoxyalkyl group,

[6] The radiation-sensitive resin composition according to any one of [1] to [5] wherein a content of the cross-linking agent (C) is 5 to 80 parts by weight with respect to 100 parts by weight of the binder resin (A),

[7] The radiation-sensitive resin composition according to any one of [1] to [6] wherein a content of the silane coupling agent (D) is 0.01 to 100 parts by weight with respect to 100 parts by weight of the binder resin (A)

[8] The radiation-sensitive resin composition according to any one of [1] to [7] further comprising a phenol resin (E), and

[9] An electronic device comprising a resin film containing a radiation-sensitive resin composition according to any one of [1] to [8].

Effects of the Invention

According to the present invention, it is possible to provide a radiation-sensitive resin composition excellent in storage stability and able to give a resin film excellent in adhesion in development and low hygroscopicity and an electronic device provided with such a radiation-sensitive resin composition.

DESCRIPTION OF EMBODIMENTS

The radiation-sensitive resin composition of the present invention contains a binder resin (A), radiation-sensitive compound (B), cross-linking agent (C), and silane coupling agent (D) represented by the later explained general formula (1).

(Binder Resin (A))

The binder resin (A) used in the present invention is not particularly limited, but a cyclic olefin polymer which has a protonic polar group (A1), an acrylic resin (A2), polyimide (A3), Cardo resin (A4), or polysiloxane (A5) is preferable. Among these as well, a cyclic olefin polymer which has a protonic polar group (A1) is particularly preferable.

These binder resins (A) may respectively be used alone or as two types or more combined.

As the cyclic olefin polymer which has a protonic polar group (A1) (below, simply referred to as the "cyclic olefin polymer (A1)"), a polymer of one or more cyclic olefin monomers or a copolymer of one or more cyclic olefin monomers and a monomer which can copolymerize with them may be mentioned, but in the present invention, as the monomer for forming the cyclic olefin polymer (A1), it is preferable to use at least a cyclic olefin monomer which has a protonic polar group (a).

Here, the "protonic polar group" means a group which contains an atom belonging to Group XV or Group XVI of the Periodic Table to which a hydrogen atom directly bonds. Among the atoms belonging to Group XV or Group XVI of the Periodic Table, atoms belonging to Period 1 or Period 2 of Group XV or Group XVI of the Periodic Table are preferable, an oxygen atom, nitrogen atom, or sulfur atom is more preferable, and an oxygen atom is particularly preferable.

As specific examples of such a protonic polar group, a hydroxyl group, carboxy group (hydroxycarbonyl group), sulfonic acid group, phosphoric acid group, and other polar groups which have oxygen atoms; primary amino group, secondary amino group, primary amide group, secondary amide group (imide group), and other polar groups which have nitrogen atoms; a thiol group and other polar groups which have sulfur atoms; etc. may be mentioned. Among these as well, ones which have oxygen atoms are preferable, carboxy group is more preferable.

In the present invention, the number of protonic polar groups which bond with the cyclic olefin resin which has protonic polar groups is not particularly limited. Further, different types of protonic polar groups may also be included.

As specific examples of the cyclic olefin monomer which has a protonic polar group (a) (below, suitably called the "monomer (a)"), acarboxy group-containing cyclic olefin such as 2-hydroxycarbonylbicyclo[2.2.1]hept-5-ene, 2-methyl-2-hydroxycarbonylbicyclo[2.2.1]hept-5-ene, 2-carboxymethyl-2-hydroxycarbonylbicyclo[2.2.1]hept-5-ene, 2-hydroxycarbonyl-2-methoxycarbonylmethylbicyclo[2.2.1]hept-5-ene, 2-hydroxycarbonyl-2-ethoxycarbonylmethylbicyclo[2.2.1]hept-5-ene, 2-hydroxycarbonyl-2-propoxycarbonylmethylbicyclo[2.2.1]hept-5-ene, 2-hydroxycarbonyl-2-butoxycarbonylmethylbicyclo[2.2.1]hept-5-ene, 2-hydroxycarbonyl-2-pentyloxycarbonylmethylbicyclo[2.2.1]hept-5-ene, 2-hydroxycarbonyl-2-hexyloxycarbonylmethylbicyclo[2.2.1]hept-5-ene, 2-hydroxycarbonyl-2-cyclohexyloxycarbonylmethylbicyclo[2.2.1]hept-5-ene, 2-hydroxycarbonyl-2-phenoxycarbonylmethylbicyclo[2.2.1]hept-5-ene, 2-hydroxycarbonyl-2-naphthyloxycarbonylmethylbicyclo[2.2.1]hept-5-ene, 2-hydroxycarbonyl-2-biphenyloxycarbonylmethylbicyclo[2.2.1]hept-5-ene, 2-hydroxycarbonyl-2-benzyloxycarbonylmethylbicyclo[2.2.1]hept-5-ene, 2-hydroxycarbonyl-2-hydroxyethoxycarbonylmethylbicyclo[2.2.1]hept-5-ene, 2,3-dihydroxycarbonylbicyclo[2.2.1]hept-5-ene, 2-hydroxycarbonyl-3-methoxycarbonylbicyclo[2.2.1]hept-5-ene, 2-hydroxycarbonyl-3-ethoxycarbonylbicyclo[2.2.1]hept-5-ene, 2-hydroxycarbonyl-3-propoxycarbonylbicyclo[2.2.1]hept-5-ene, 2-hydroxycarbonyl-3-butoxycarbonylbicyclo[2.2.1]hept-5-ene, 2-hydroxycarbonyl-3-pentyloxycarbonylbicyclo[2.2.1]hept-5-ene, 2-hydroxycarbonyl-3-hexyloxycarbonylbicyclo[2.2.1]hept-5-ene, 2-hydroxycarbonyl-3-cyclohexyloxycarbonylbicyclo[2.2.1]hept-5-ene, 2-hydroxycarbonyl-3-phenoxycarbonylbicyclo[2.2.1]hept-5-ene, 2-hydroxycarbonyl-3-naphthyloxycarbonylbicyclo[2.2.1]hept-5-ene, 2-hydroxycarbonyl-3-biphenyloxycarbonylbicyclo[2.2.1]hept-5-ene, 2-hydroxycarbonyl-3-benzyloxycarbonylbicyclo[2.2.1]hept-5-ene, 2-hydroxycarbonyl-3-hydroxyethoxycarbonylbicyclo[2.2.1]hept-5-ene, 2-hydroxycarbonyl-3-hydroxycarbonylmethylbicyclo[2.2.1]hept-5-ene, 3-methyl-2-hydroxycarbonylbicyclo[2.2.1]hept-5-ene, 3-hydroxymethyl-2-hydroxycarbonylbicyclo[2.2.1]hept-5-ene, 2-hydroxycarbonyltricyclo[5.2.1.0$^{2,6}$]deca-3,8-diene, 4-hydroxycarbonyltetracyclo[6.2.1.1$^{3,6}$.0$^{2,7}$]dodec-9-ene, 4-methyl-4-hydroxycarbonyltetracyclo[6.2.1.1$^{3,6}$.0$^{2,7}$]dodec-9-ene, 4,5-dihydroxycarbonyltetracyclo[6.2.1.1$^{3,6}$.0$^{2,7}$]dodec-9ene, 4-carboxymethyl-4-hydroxycarbonyltetracyclo[6.2.1.1$^{3,6}$.0$^{2,7}$]dodec-9-ene, N-(hydroxycarbonylmethyl)bicyclo[2.2.1]hept-5-ene-2,3-dicarboxyimide, N-(hydroxycarbonylethyl)bicyclo[2.2.1]hept-5-ene-2,3-dicarboxyimide, N-(hydroxycarbonylpentyl)bicyclo[2.2.1]hept-5-ene-2,3-dicarboxyimide, N-(dihydroxycarbonylethyl)bicyclo[2.2.1]hept-5-ene-2,3-dicarboxyimide, N-(dihydroxycarbonylpropyl)bicyclo[2.2.1]hept-5-ene-2,3-dicarboxyimide, N-(hydroxycarbonylphenethyl)bicyclo[2.2.1]hept-5-ene-2,3-dicarboxyimide, N-(2-(4-hydroxyphenyl)-1-(hydroxycarbonyl)ethyl)bicyclo[2.2.1]hept-5-ene-2,3-dicarboxyimide, and N-(hydroxycarbonylphenyl)bicyclo[2.2.1]hept-5-ene-2,3-dicarboxyimide; a hydroxyl group-containing cyclic olefin such as 2-(4-hydroxyphenyl)bicyclo[2.2.1]hept-5-ene, 2-methyl-2-(4-hydroxyphenyl)bicyclo[2.2.1]hept-5-ene, 4-(4-hydroxyphenyl)tetracyclo[6.2.1.1$^{3,6}$.0$^{2,7}$]dodec-9-ene, 4-methyl-4-hydroxyphenyl)tetracyclo[6.2.1.1$^{3,6}$.0$^{2,7}$]dodec-9ene, 2-hydroxybicyclo[2.2.1]hept-5-ene, 2-hydroxymethylbicyclo[2.2.1]hept-5-ene, 2-hydroxyethylbicyclo[2.2.1]hept-5-ene, 2-methyl-2-hydroxymethylbicyclo[2.2.1]hept-5-ene, 2,3-dihydroxymethylbicyclo[2.2.1]hept-5-ene, 2-(hydroxyethoxycarbonyl)bicyclo[2.2.1]hept-5-ene, 2-methyl-2-(hydroxyethoxycarbonyl)bicyclo[2.2.1]hept-5-ene, 2-(1-hydroxy-1-trifluoromethyl-2,2,2-trifluoroethyl)bicyclo[2.2.1]hept-5-ene, 2-(2-hydroxy-2-trifluoromethyl-3,3,3-trifluoropropyl)bicyclo[2.2.1]hept-5-ene, 3-hydroxytricyclo[5.2.1.0$^{2,6}$]deca-4,8-diene, 3-hydroxymethyltricyclo[5.2.1.0$^{2,6}$]deca-4,8-diene, 4-hydroxytetracyclo[6.2.1.1$^{3,6}$.0$^{2,7}$]dodec-9-ene, 4-hydroxymethyltetracyclo[6.2.1.1$^{3,6}$.0$^{2,7}$]dodec-9-ene, 4,5-dihydroxymethyltetracyclo[6.2.1.1$^{3,6}$.0$^{2,7}$]dodec-9-ene, 4-(hydroxyethoxycarbonyl)tetracyclo[6.2.1.1$^{3,6}$.0$^{2,7}$]dodec-9-ene, 4-methyl-4-(hydroxyethoxycarbonyl)tetracyclo[6.2.1.1$^{3,6}$.0$^{2,7}$]dodec-9-ene, N-(hydroxyethyl)bicyclo[2.2.1]hept-5-ene-2,3- dicarboxyimide, and N-(hydroxyphenyl)bicyclo[2.2.1]hept-5-ene-2,3-dicarboxyimide etc. may be mentioned. Among these as well, from the viewpoint of the adhesion of the obtained resin film becoming higher, carboxy group-containing cyclic olefins are preferable, while 4-hydroxycarbonyltetracyclo[6.2.1.1$^{3,6}$.0$^{2,7}$]dodec-9-ene is particularly preferable. These monomers (a) may respectively be used alone or may be used as two types or more combined.

In the cyclic olefin polymer (A1), the ratio of content of the units of the monomer (a) is preferably 10 to 90 mol % with respect to all monomer units, more preferably 20 to 80 mol %, still more preferably 30 to 70 mol %. If the ratio of content of the units of the monomer (a) is too small, the radiation sensitivity is liable to become insufficient and undissolved residue is liable to be formed at the time of development, if too great, the cyclic olefin polymer (A1) is liable to become insufficient in solubility in a polar solvent.

Further, the cyclic olefin polymer (A1) used in the present invention may be a copolymer which is obtained by copolymerization of a cyclic olefin monomer which has a protonic polar group (a) and a monomer (b) which can copolymerize with this. As such a copolymerizable monomer, a cyclic olefin monomer which has a polar group other than a protonic polar group (b1), a cyclic olefin monomer which does not have a polar group (b2), and a monomer other than a cyclic olefin (b3) (below, suitably called the "monomer (b1)", "monomer (b2)", and "monomer (b3)") may be mentioned.

As the cyclic olefin monomer which has a polar group other than a protonic polar group (b1), for example, a cyclic olefin which has an N-substituted imide group, ester group, cyano group, acid anhydride group, or halogen atom may be mentioned.

As a cyclic olefin which has an N-substituted imide group, for example, a monomer represented by the following formula (2) or a monomer represented by the following formula (3) may be mentioned.

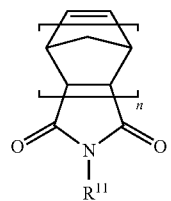
(2)

(In the above formula (2), $R^{11}$ indicates a hydrogen atom or alkyl group or aryl group having 1 to 16 carbon atoms. "n" indicates an integer of 1 to 2.)

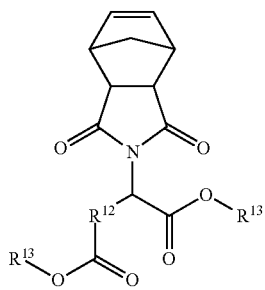
(3)

(In the above formula (3), $R^{12}$ indicates a bivalent alkylene group having 1 to 3 carbon atoms, while $R^{13}$ indicates a monovalent alkyl group having 1 to 10 carbon atoms or a monovalent halogenated alkyl group having 1 to 10 carbon atoms.)

In the above formula (2), $R^{11}$ is an alkyl group or aryl group having 1 to 16 carbon atoms. As specific examples of the alkyl group, a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, and other straight chain alkyl groups; cyclopropyl group, cyclobutyl group, cyclopentyl group, cyclohexyl group, cycloheptyl group, cyclooctyl group, cyclononyl group, cyclodecyl group, cycloundecyl group, cyclododecyl group, norbornyl group, bornyl group, isobornyl group, decahydronaphthyl group, tricyclodecanyl group, adamantyl group, and other cyclic alkyl groups; 2-propyl group, 2-butyl group, 2-methyl-1-propyl group, 2-methyl-2-propyl group, 1-methylbutyl group, 2-methylbutyl group, 1-methylpentyl group, 1-ethylbutyl group, 2-methylhexyl group, 2-ethylhexyl group, 4-methylheptyl group, 1-methylnonyl group, 1-methyltridecyl group, 1-methyltetradecyl group, and other branched alkyl groups; etc. may be mentioned. Further, as specific examples of the aryl group, a benzyl group etc. may be mentioned. Among these as well, due to the more excellent heat resistance and solubility in a polar solvent, an alkyl group and aryl group having 1 to 14 carbon atoms are preferable, while an alkyl group and aryl group having 6 to 10 carbon atoms are more preferable. If the number of carbon atoms is 4 or less, the solubility in a polar solvent is inferior, while if the number of carbon atoms is 17 or more, the heat resistance is inferior. Further, when patterning the resin film, there is the problem that the resin film melts by heat and the patterns to end up disappearing.

As specific examples of the monomer represented by the above general formula (2), bicyclo[2.2.1]hept-5-ene-2,3-dicarboxyimide, N-phenyl-bicyclo[2.2.1]hept-5-ene-2,3-dicarboxyimide, N-methylbicyclo[2.2.1]hept-5-ene-2,3-dicarboxyimide, N-ethylbicyclo[2.2.1]hept-5-ene-2,3-dicarboxyimide, N-propylbicyclo[2.2.1]hept-5-ene-2,3-dicarboxyimide, N-butylbicyclo[2.2.1]hept-5-ene-2,3-dicarboxyimide, N-cyclohexylbicyclo[2.2.1]hept-5-ene-2,3-dicarboxyimide, N-adamantylbicyclo[2.2.1]hept-5-ene-2,3-dicarboxyimide, N-(1-methylbutyl)-bicyclo[2.2.1]hept-5-ene-2,3-dicarboxyimide, N-(2-methylbutyl)-bicyclo[2.2.1]hept-5-ene-2,3-dicarboxyimide, N-(1-methylpentyl)-bicyclo[2.2.1]hept-5-ene-2,3-dicarboxyimide, N-(2-methylpentyl)-bicyclo[2.2.1]hept-5-ene-2,3-dicarboxyimide, N-(1-ethylbutyl)-bicyclo[2.2.1]hept-5-ene-2,3-dicarboxyimide, N-(2-ethylbutyl)-bicyclo[2.2.1]hept-5-ene-2,3-dicarboxyimide, N-(1-methylhexyl)-bicyclo[2.2.1]hept-5-ene-2,3-dicarboxyimide, N-(2-methylhexyl)-bicyclo[2.2.1]hept-5-ene-2,3-dicarboxyimide, N-(3-methylhexyl)-bicyclo[2.2.1]hept-5-ene-2,3-dicarboxyimide, N-(1-butylpentyl)-bicyclo[2.2.1]hept-5-ene-2,3-dicarboxyimide, N-(2-butylpentyl)-bicyclo[2.2.1]hept-5-ene-2,3-dicarboxyimide, N-(1-methylheptyl)-bicyclo[2.2.1]hept-5-ene-2,3-dicarboxyimide, N-(2-methylheptyl)-bicyclo[2.2.1]hept-5-ene-2,3-dicarboxyimide, N-(3-methylheptyl)-bicyclo[2.2.1]hept-5-ene-2,3-dicarboxyimide, N-(4-methylheptyl)-bicyclo[2.2.1]hept-5-ene-2,3-dicarboxyimide, N-(1-ethylhexyl)-bicyclo[2.2.1]hept-5-ene-2,3-dicarboxyimide, N-(2-ethylhexyl)-bicyclo[2.2.1]hept-5-ene-2,3-dicarboxyimide, N-(3-ethylhexyl)-bicyclo[2.2.1]hept-5-ene-2,3-dicarboxyimide, N-(1-propylpentyl)-bicyclo[2.2.1]hept-5-ene-2, 3-dicarboxyimide, N-(2-propylpentyl)-bicyclo[2.2.1]hept-5-ene-2,3-dicarboxyimide, N-(1-methyloctyl)-bicyclo[2.2.1]hept-5-ene-2,3-dicarboxyimide, N-(2-methyloctyl)-bicyclo[2.2.1]hept-5-ene-2,3-dicarboxyimide, N-(3-methyloctyl)-bicyclo[2.2.1]hept-5-ene-2,3-dicarboxyimide, N-(4-methyloctyl)-bicyclo[2.2.1]hept-5-ene-2,3-dicarboxyimide, N-(1-ethylheptyl)-bicyclo[2.2.1]hept-5-ene-2,3-dicarboxyimide, N-(2-ethylheptyl)-bicyclo[2.2.1]hept-5-ene-2,3-dicarboxyimide, N-(3-ethylheptyl)-bicyclo[2.2.1]hept-5-ene-2,3-dicarboxyimide, N-(4-ethylheptyl)-bicyclo[2.2.1]hept-5-ene-2,3-dicarboxyimide, N-(1-propylhexyl)-bicyclo[2.2.1]hept-5-ene-2,3-dicarboxyimide, N-(2-propylhexyl)-bicyclo[2.2.1]hept-5-ene-2,3-dicarboxyimide, N-(3-propylhexyl)-bicyclo[2.2.1]hept-5-ene-2,3-dicarboxyimide, N-(1-methylnonyl)-bicyclo[2.2.1]hept-5-ene-2,3-dicarboxyimide, N-(2-methylnonyl)-bicyclo[2.2.1]hept-5-ene-2,3-dicarboxyimide, N-(3-methylnonyl)-bicyclo[2.2.1]hept-5-ene-2,3-dicarboxyimide, N-(4-methylnonyl)-bicyclo[2.2.1]hept-5-ene-2,3-dicarboxyimide, N-(5-methylnonyl)-bicyclo[2.2.1]hept-5-ene-2,3-dicarboxyimide, N-(1-ethyloctyl)-bicyclo[2.2.1]hept-5-ene-2,3-dicarboxyimide, N-(2-ethyloctyl)-bicyclo[2.2.1]hept-5-ene-2,3-dicarboxyimide, N-(3-ethyloctyl)-bicyclo[2.2.1]hept-5-ene-2,3-dicarboxyimide, N-(4-ethyloctyl)-bicyclo[2.2.1]hept-5-ene-2,3-dicarboxyimide, N-(1-methyldecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methylundecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methyltridecyl)-bicyclo[2.2.1]hept-5-ene-2,3-dicarboxyimide, N-(1-methyltetradecyl)-bicyclo[2.2.1]hept-5-ene-2,3-dicarboxyimide, N-(1-methylpentadecyl)-bicyclo[2.2.1]hept-5-ene-2,3-dicarboxyimide, N-phenyl-tetracyclo[6.2.1.1$^{3,6}$.0$^{2,7}$]dodec-9-ene-4,5-dicarboxyimide, N-(2,4-dimethoxyphenyl)-tetracyclo[6.2.1.1$^{3,6}$.0$^{2,7}$]dodec-9-ene-4,5-dicarboxyimide, etc. may be mentioned. Note that, these may respectively be used alone or may be used as two types or more combined.

On the other hand, in the above general formula (3), $R^{12}$ is a bivalent alkylene group having 1 to 3 carbon atoms. As the bivalent alkylene group having 1 to 3 carbon atoms, a methylene group, ethylene group, propylene group, and isopropylene group may be mentioned. Among these as well, due to the excellent polymerization activity, a methylene group and ethylene group are preferable.

Further, in the above general formula (3), $R^{13}$ is a monovalent alkyl group having 1 to 10 carbon atoms or monovalent halogenated alkyl group having 1 to 10 carbon atoms. As the monovalent alkyl group having 1 to 10 carbon atoms, for example, a methyl group, ethyl group, propyl group, isopropyl group, butyl group, sec-butyl group, tert-butyl group, hexyl group, cyclohexyl group, etc. may be mentioned. As the monovalent halogenated alkyl group having 1 to 10 carbon atoms, for example, a fluoromethyl group, chloromethyl group, bromomethyl group, difluoromethyl group, dichloromethyl group, difluoromethyl group, trifluoromethyl group, trichloromethyl group, 2,2,2-trifluoroethyl group, pentafluoroethyl group, heptafluoropropyl group, perfluorobutyl group, perfluoropentyl group, etc. may be mentioned. Among these as well, since the solubility in a polar solvent is excellent, as $R^{13}$, a methyl group or ethyl group is preferable.

Note that, the monomer represented by the above general formulas (2) and (3) can, for example, be obtained by an imidization reaction between a corresponding amine and 5-norbornene-2,3-dicarboxylic acid anhydride. Further, the obtained monomer can be efficiently isolated by separating and refining the reaction solution of the imidization reaction by a known method.

As the cyclic olefin which has an ester group, for example, 2-acetoxybicyclo[2.2.1]hept-5-ene, 2-acetoxymethylbicyclo[2.2.1]hept-5-ene, 2-methoxycarbonylbicyclo[2.2.1]hept-5-ene, 2-ethoxycarbonylbicyclo[2.2.1]hept-5-ene, 2-propoxycarbonylbicyclo[2.2.1]hept-5-ene, 2-butoxycarbonylbicyclo[2.2.1]hept-5-ene, 2-cyclohexyloxycarbonylbicyclo[2.2.1]hept-5-ene, 2-methyl-2-methoxycarbonylbicyclo[2.2.1]hept-5-ene, 2-methyl-2-ethoxycarbonylbicyclo[2.2.1]hept-5-ene, 2-methyl-2-propoxycarbonylbicyclo[2.2.1]hept-5-ene, 2-methyl-2-butoxycarbonylbicyclo[2.2.1]hept-5-ene, 2-methyl-2-cyclohexyloxycarbonylbicyclo[2.2.1]hept-5-ene, 2-(2,2,2-trifluoroethoxycarbonyl)bicyclo[2.2.1]hept-5-ene, 2-methyl-2-(2,2,2-trifluoroethoxycarbonyl)bicyclo[2.2.1]hept-5-ene, 2-methoxycarbonyltricyclo[5.2.1.0$^{2,6}$]dec-8-ene, 2-ethoxycarbonyltricyclo[5.2.1.0$^{2,6}$]dec-8-ene, 2-propoxycarbonyltricyclo[5.2.1.0$^{2,6}$]dec-8-ene, 4-acetoxytetracyclo[6.2.1.1$^{3,6}$.0$^{2,7}$]dodec-9-ene, 4-methoxycarbonyltetracyclo[6.2.1.1$^{3,6}$.0$^{2,7}$]dodec-9-ene, 4-ethoxycarbonyltetracyclo[6.2.1.1$^{3,6}$.0$^{2,7}$]dodec-9-ene, 4-propoxycarbonyltetracyclo[6.2.1.1$^{3,6}$.0$^{2,7}$]dodec-9-ene, 4-butoxycarbonyltetracyclo[6.2.1.1$^{3,6}$.0$^{2,7}$]dodec-9-ene, 4-methyl-4-methoxycarbonyltetracyclo[6.2.1.1$^{3,6}$.0$^{2,7}$]dodec-9-ene, 4-methyl-4-ethoxycarbonyltetracyclo[6.2.1.1$^{3,6}$.0$^{2,7}$]dodec-9-ene, 4-methyl-4-propoxycarbonyltetracyclo[6.2.1.1$^{3,6}$.0$^{2,7}$]dodec-9-ene, 4-methyl-4-butoxycarbonyltetracyclo[6.2.1.1$^{3,6}$.0$^{2,7}$]dodec-9-ene, 4-(2,2,2-trifluoroethoxycarbonyl)tetracyclo[6.2.1.1$^{3,6}$.0$^{2,7}$]dodec-9-ene, 4-methyl-4-(2,2,2-trifluoroethoxycarbonyl)tetracyclo[6.2.1.1$^{3,6}$.0$^{2,7}$]dodec-9-ene, etc. may be mentioned.

As the cyclic olefin which has a cyano group for example 4-cyanotetracyclo[6.2.1.1$^{3,6}$.0$^{2,7}$]dodec-9-ene, 4-methyl-4-cyanotetracyclo[6.2.1.1$^{3,6}$.0$^{2,7}$]dodec-9-ene, 4,5-dicyanotetracyclo[6.2.1.1$^{3,6}$.0$^{2,7}$]dodec-9-ene, 2-cyanobicyclo[2.2.1]hept-5-ene, 2-methyl-2-cyanobicyclo[2.2.1]hept-5-ene, 2,3-dicyanobicyclo[2.2.1]hept-5-ene, etc. may be mentioned.

As the cyclic olefin which has an acid anhydride group, for example, tetracyclo[6.2.1.1$^{3,6}$.0$^{2,7}$]dodec-9-ene-4,5-dicarboxylic anhydride, bicyclo[2.2.1]hept-5-ene-2,3-dicarboxylic anhydride, 2-carboxymethyl-2-hydroxycarbonylbicyclo[2.2.1]hept-5-ene anhydride, etc. may be mentioned.

As the cyclic olefin which has a halogen atom, for example, 2-chlorobicyclo[2.2.1]hept-5-ene, 2-chloromethylbicyclo[2.2.1]hept-5-ene, 2-(chlorophenyl)bicyclo[2.2.1]hept-5-ene, 4-chlorotetracyclo[6.2.1.1$^{3,6}$.0$^{2,7}$]dodec-9-ene, 4-methyl-4-chlorotetracyclo[6.2.1.1$^{3,6}$.0$^{2,7}$]dodec-9-ene, etc. may be mentioned.

These monomers (b1) may respectively be used alone or may be used as two types or more combined.

As the cyclic olefin monomer which does not have a polar group (b2), bicyclo[2.2.1]hept-2-ene (also called "norbornene"), 5-ethylbicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[5.2.1.0$^{2,6}$]deca-3,8-diene (common name: dicyclopentadiene), tetracyclo[10.2.1.0$^{2,11}$.0$^{4,9}$]pentadec-4,6,8,13-tetraene, tetracyclo[6.2.1.1$^{3,6}$.0$^{2,7}$]dodec-4-ene (also called "tetracyclododecene"), 9-methyl-tetracyclo[6.2.1.1$^{3,6}$.0$^{2,7}$]dodec-4-ene, 9-ethyl-tetracyclo[6.2.1.1$^{3,6}$.0$^{2,7}$]dodec-4-ene, 9-methylidene-tetracyclo[6.2.1.1$^{3,6}$.0$^{2,7}$]dodec-4-ene, 9-ethylidene-tetracyclo[6.2.1.1$^{3,6}$.0$^{2,7}$]dodec-4-ene, 9-vinyl-tetracyclo[6.2.1.1$^{3,6}$.0$^{2,7}$]dodec-4-ene, 9-propenyl-tetracyclo[6.2.1.1$^{3,6}$.0$^{2,7}$]dodec-4-ene, pentacyclo[9.2.1.1$^{3,9}$.0$^{2,10}$.0$^{4,8}$]pentadeca-5,12-diene, cyclobutene, cyclopentene, cyclopentadiene, cyclohexene, cycloheptene, cyclooctene, cyclooctadiene, indene, 3a,5,6,7a-tetrahydro-4,7-methano-1H-indene, 9-phenyl-tetracyclo[6.2.1.1$^{3,6}$.0$^{2,7}$]dodec-4-ene, tetracyclo[9.2.1.0$^{2,10}$.0$^{3,8}$]tetradec-3,5,7,12-tetraene, pentacyclo[9.2.1.1$^{3,9}$.0$^{2,10}$.0$^{4,8}$]pentadec-12-ene, etc. may be mentioned.

These monomers (b2) may respectively be used alone or may be used as two types or more combined.

As specific examples of the monomer other than a cyclic olefin (b3), ethylene; propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and other $C_2$ to $C_{20}$ α-olefins; 1,4-hexadiene, 1,5-hexadiene, 4-methyl-1,4-hexadiene, 5-methyl-1,4-hexadiene, 1,7-octadiene, and other nonconjugated dienes and their derivatives; etc. may be mentioned. Among these as well, α-olefin is preferable.

These monomers (b3) may respectively be used alone or may be used as two types or more combined.

Among these monomers (b1) to (b3) as well, from the viewpoint of the effect of the present invention becoming more remarkable, a cyclic olefin monomer which has a polar group other than a protonic polar group (b1) is preferable, while a cyclic olefin which has an N-substituted imide group is particularly preferable.

In the cyclic olefin polymer (A1), the ratio of content of units of the copolymerizable monomer (b) is preferably 10 to 90 mol % with respect to the total monomer units, more preferably 20 to 80 mol %, still more preferably 30 to 70 mol %. If the ratio of content of the units of the copolymerizable monomer (b) is too small, the cyclic olefin polymer (A1) is liable to become insufficient in solubility in a polar solvent, while if too great, the radiation sensitivity is liable to become insufficient and undissolved residue is liable to be formed at the time of development.

Note that, in the present invention, it is also possible to introduce a protonic group in a cyclic olefin-based polymer which does not have a protonic polar group utilizing a known modifying agent so as to obtain the cyclic olefin polymer (A1).

The polymer which does not have a protonic polar group can be obtained by polymerizing at least one of the above-mentioned monomers (b1) and (b2) and, in accordance with need, a monomer (b3) in any combination.

As a modifying agent for introduction of a protonic polar group, usually a compound which has a protonic polar group and a reactive carbon-carbon unsaturated bond in a single molecule is used.

As specific examples of this compound, acrylic acid, methacrylic acid, angelic acid, tiglic acid, oleic acid, elaidic acid, erucic acid, brassidic acid, maleic acid, fumaric acid, citraconic acid, mesaconic acid, itaconic acid, atropic acid, cinnamic acid, or other unsaturated carboxylic acid; allyl alcohol, methylvinyl methanol, crotyl alcohol, methacryl alcohol, 1-phenylethen-1-ol, 2-propen-1-ol, 3-buten-1-ol, 3-buten-2-ol, 3-methyl-3-buten-1-ol, 3-methyl-2-buten-1-ol, 2-methyl-3-buten-2-ol, 2-methyl-3-buten-1-ol, 4-penten-1-ol, 4-methyl-4-penten-1-ol, 2-hexen-1-ol, or other unsaturated alcohol; etc. may be mentioned.

The modification reaction of a polymer in which these modifying agents are used may be performed in accordance with an ordinary method and is usually performed in the presence of a radical generator.

Note that, the cyclic olefin polymer (A1) used in the present invention may be a ring-opened polymer obtained by ring-opening polymerization of the above-mentioned monomers or may be an addition polymer obtained by addition polymerization of the above-mentioned monomers, but from the viewpoint of the effect of the present invention becoming more remarkable, a ring-opened polymer is preferable.

A ring-opened polymer can be produced by ring-opening metathesis polymerization of a cyclic olefin monomer which has a protonic polar group (a) and a copolymerizable monomer (b) used according to need in the presence of a metbathesis reaction catalyst. As the method of production, for example, the method described in International Publication No. 2010/110323A, [0039] to [0079], etc. can be used.

Further, when the cyclic olefin polymer (A1) used in the present invention is a ring-opened polymer, it is preferable to further perform a hydrogenation reaction and obtain a hydrogenated product in which the carbon-carbon double bonds which are contained in the main chain are hydrogenated. When the cyclic olefin polymer (A1) is a hydrogenated product, the ratio of the hydrogenated carbon-carbon double bonds (hydrogenation rate) is usually 50% or more. From the viewpoint of the heat resistance, 70% or more is preferable, 90% or more is more preferable, and 95% or more is furthermore preferable.

Further, the acrylic resin (A2) used in the present invention is not particularly limited, but a homopolymer or copolymer having at least one of a carboxylic acid which has an acryl group, carboxylic anhydride which has an acryl group, epoxy group-containing acrylate compound and oxetane group-containing acrylate compound as an essential ingredient is preferable.

As specific examples of the carboxylic acid which has an acryl group, (meth)acrylic acid (meaning acrylic acid and/or methacrylic acid, below, same for methyl(meth)acrylate etc.), crotonic acid, maleic acid, fumaric acid, citraconic acid, mesaconic acid, glutaconic acid, phthalic acid mono-(2-((meth)acryloyloxy)ethyl), N-(carboxyphenyl)maleimide, N-(carboxyphenyl) (meth)acrylamide, etc. may be mentioned.

As specific examples of the carboxylic anhydride which has an acryl group, maleic anhydride, citraconic anhydride, etc. may be mentioned.

As specific examples of the epoxy group-containing acrylate compound, glycidyl acrylate, glycidyl methacrylate, glycidyl α-ethyl acrylate, glycidyl α-n-propyl acrylate, glycidyl α-n-butyl acrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethyacrylate, 3,4-epoxycyclohexylmethyl acrylate, 3,4-epoxycyclohexylmethyl methacrylate, etc. may be mentioned.

As specific examples of the oxetane group-containing acrylate compound, (3-methyloxetan-3-yl)methyl (meth)acrylate, (3-ethyloxetan-3-yl)methyl (meth)acrylate, (3-methyloxetan-3-yl)ethyl (meth)acrylate, (3-ethyloxetan-3-yl)ethyl (meth)acrylate, (3-chloromethyloxetan-3-yl) methyl (meth)acrylate, (oxetan-2-yl)methyl (meth)acrylate, (2-methyloxetan-2-yl)methyl (meth)acrylate, (2-ethyloxetan-2-yl)methyl (meth)acrylate, (1-methyl-1-oxetanyl-2-phenyl)-3-(meth)acrylate, (1-methyl-1-oxetanyl)-2-trifluoromethyl-3-(meth)acrylate, and (1-methyl-1-oxetanyl)-4-trifluoromethyl-2-(meth)acrylate, etc. may be mentioned.

Among these as well, (meth)acrylic acid, maleic anhydride, glycidyl (meth)acrylate, 6,7-epoxyheptyl methacrylate, etc. are preferable.

The acrylic resin (A2) may also be a copolymer of at least one compound which is selected from unsaturated carboxylic acids, unsaturated carboxylic anhydrides, and epoxy group-containing unsaturated compounds, and other acrylate-based monomers or copolymerizable monomers other than acrylates.

As other acrylate-based monomers, methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, amyl (meth)acrylate, isoamyl (meth)acrylate, hexyl (meth)acrylate, heptyl (meth)acrylate, octyl (meth)acrylate, isooctyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, and other alkyl (meth)acrylates; hydroxyethyl (meth)acrylate, 2-hydroxypropyl (meth) acrylate, 3-hydroxypropyl (meth)acrylate, 2-hydroxybutyl (meth)acrylate, 3-hydroxybutyl (meth)acrylate, 4-hydroxybutyl (meth)acrylate, and other hydroxyalkyl (meth)acrylates; phenoxyethyl (meth)acrylate, 2-hydroxy-3-phenoxypropyl (meth)acrylate, and other phenoxyalkyl (meth) acrylates; 2-methoxyethyl (meth)acrylate, 2-ethoxyethyl (meth)acrylate, 2-propoxyethyl (meth)acrylate, 2-butoxyethyl (meth)acrylate, 2-methoxybutyl (meth)acrylate, and other alkoxyalkyl (meth)acrylates; polyethylene glycol mono(meth)acrylate, ethoxydiethylene glycol (meth)acrylate, methoxypolyethylene glycol (meth)acrylate, phenoxypolyethylene glycol (meth)acrylate, nonyl phenoxypolyethylene glycol (meth)acrylate, polypropylene glycol mono (meth)acrylate, methoxypolypropylene glycol (meth) acrylate, ethoxypolypropylene glycol (meth)acrylate, nonylphenoxypolypropylene glycol (meth)acrylate, and other polyalkylene glycol (meth)acrylates; cyclohexyl (meth)acrylate, 2-methylcyclohexyl (meth)acrylate, 4-butyl-cyclohexyl (meth)acrylate, 1-adamantyl (meth)acrylate, 2-methyl-2-adamantyl (meth)acrylate, 2-ethyl-2-adamantyl (meth)acrylate, tricyclo[5.2.1.0$^{2,6}$]decan-8-yl (meth)acrylate, tricyclo[5.2.1.0$^{2,6}$]-3-decen-8-yl (meth)acrylate, tricyclo[5.2.1.0$^{2,6}$]-3-decen-9-yl (meth)acrylate, bornyl (meth) acrylate, isobornyl (meth)acrylate, and other cycloalkyl (meth)acrylates; phenyl (meth)acrylate, naphthyl (meth) acrylate, biphenyl (meth)acrylate, benzyl (meth)acrylate, tetrahydrofurfuryl (meth)acrylate, 5-tetrahydrofurfuryl oxycarbonylpentyl (meth)acrylate, vinyl (meth)acrylate, allyl (meth)acrylate, 2-(2-vinyloxyethoxy)ethyl (meth)acrylate, 2-[tricyclo[5.2.1.0$^{2,6}$]decan-8-yloxy]ethyl (meth)acrylate, 2-[tricyclo[5.2.1.0$^{2,6}$]-3-decen-8-yloxy]ethyl (meth)acrylate, 2-[tricyclo[5.2.1.0$^{2,6}$]-3-decen-9-yloxy]ethyl (meth) acrylate, γ-butyrolactone (meth)acrylate, maleimide, N-methylmaleimide, N-ethylmaleimide, N-butylmaleimide, N-cyclohexylmaleimide, N-benzylmaleimide, N-phenylmaleimide, N-(2,6-diethylphenyl)maleimide, N-(4-acetylphenyl)maleimide, N-(4-hydroxyphenyl)maleimide, N-(4-acetoxyphenyl)maleimide, N-(4-dimethylamino-3,5-dinitrophenyl)maleimide, N-(1-anilinonaphthyl-4)maleimide, N-[4-(2-benzooxazolyl)phenyl]maleimide, N-(9-acridinyl)maleimide, etc. may be mentioned.

Among these as well, methyl (meth)acrylate, butyl (meth) acrylate, cyclohexyl (meth)acrylate, 2-methylcyclohexyl (meth)acrylate, benzyl (meth)acrylate, tricyclo[5.2.1.0$^{2,6}$]decan-8-yl (meth)acrylate, N-phenylmaleimide, N-cyclohexylmaleimide, etc. are preferable.

The copolymerizable monomer other than acrylate is not particularly limited so long as a compound which can copolymerize with the above carboxylic acid which has an acryl group, carboxylic anhydride which has an acryl group, epoxy group-containing acrylate compound, but, for example, vinylbenzylmethyl ether, vinylglycidyl ether, styrene, α-methylstyrene, vinyltoluene, indene, vinylnaphthalene, vinylbiphenyl, chlorostyrene, bromostyrene, chloromethylstyrene, p-tert-butoxystyrene, p-hydroxystyrene, p-hydroxy-α-methylstyrene, p-acetoxystyrene, p-carboxystyrene, 4-hydroxyphenylvinylketone, acrylonitrile, methacrylonitrile, (meth)acrylamide, 1,2-epoxy-4-vinylcyclohexane, isobutene, norbornene, butadiene, isoprene, and other radical polymerizable compounds may be mentioned.

These compounds may respectively be used alone or may be used as two types or more combined.

The polymerization method of the above monomer may be an ordinary method. For example, the suspension polymerization method, the emulsion polymerization method, the solution polymerization method, etc. may be employed.

The polyimide (A3) used in the present invention can be obtained by heat treating a polyimide precursor obtained by reacting a tetracarboxylic anhydride and diamine. As the precursor for obtaining the polyimide, a polyamic acid, polyamic acid ester, polyisoimide, polyamic acid sulfonamide, etc. may be mentioned.

The polyimide (A3) used in the present invention is synthesized by a known method. That is, it is synthesized by a known method such as selectively combining tetracarboxylic dianhydride and a diamine and reacting these in N-methyl-2-pyrrolidone, N,N-dimethylacetoamide, N,N-dimethylformamide, dimethylsulfoxide, hexamethylphosphoric triamide, γ-butyrolactone, cyclopentanone, or other polar solvent.

When excessively using a diamine for polymerization, it is possible to make a carboxylic anhydride react with the end amino group of the produced polyimide (A3) so as to protect the end amino group. Further, when excessively using tetracarboxylic anhydride for polymerization, it is possible to make an amine compound react with the end acid anhydride group of the produced polyimide (A3) so as to protect the end acid anhydride group.

As examples of such carboxylic anhydrides, phthalic anhydride, trimellitic anhydride, maleic anhydride, naphthalic anhydride, hydrogenated phthalic anhydride, methyl-5-norbornene-2,3-dicarboxylic anhydride, itaconic anhydride, tetrahydrophthalic acid anhydride, etc. may be mentioned, while as examples of amine compounds, aniline, 2-hydroxyaniline, 3-hydroxyaniline, 4-hydroxyaniline, 2-ethynylaniline, 3-ethynylaniline, 4-ethynylaniline, etc. may be mentioned.

The Cardo resin (A4) used in the present invention is a resin which has a Cardo structure, that is, a skeletal structure with two cyclic structures bonded to a quaternary carbon atom which forms a cyclic structure. A general form of a Cardo structure is a structure in which benzene rings bond to a fluorene ring.

As specific examples of a skeletal structure where two cyclic structures are bonded to a quaternary carbon atom forming a cyclic structure, a fluorene skeleton, bisphenol fluorene skeleton, bisaminophenyl fluorene skeleton, fluorine skeleton having an epoxy group, fluorene skeleton having an acryl group, etc. may be mentioned.

The Cardo resin (A4) used in the present invention is formed by polymerization by reacting functional groups which bond to skeletons having Cardo structure each other. The Cardo resin (A4) has a structure where the main chain and bulky side chains are connected by a single element (Cardo structure) and has a cyclic structure in the direction substantially vertical to the main chain.

As one example of the Cardo structure, an example of a Cardo structure having an acrylate structure is shown in the following formula (4).

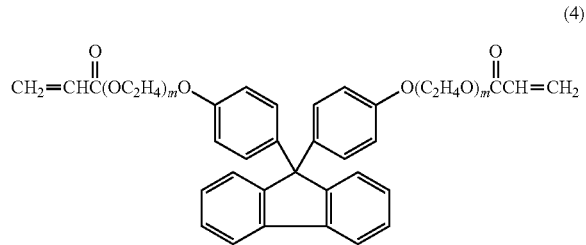

(4)

(In the above formula (4), "m" is an integer of 0 to 10.)

The monomer which has a Cardo structure is, for example, a bis(glycidyloxyphenyl)fluorene-type epoxy resin; a condensate of a bisphenolfluorene-type epoxy resin and acrylic acid; 9,9-bis(4-hydroxyphenyl)fluorene, 9,9-bis (4-hydroxy-3-methylphenyl)fluorene, or other Cardo structure-containing bisphenols; 9,9-bis(cyanomethyl)fluorene or other 9,9-bis(cyanoalkyl)fluorenes; 9,9-bis(3-aminopropyl) fluorene or other 9,9-bis(aminoalkyl)fluorenes; etc. may be mentioned.

The Cardo resin (A4) is a polymer which is obtained by polymerization of a monomer which has a Cardo structure, but may also be a copolymer with another copolymerizable monomer.

The polymerization method of the above monomers may be an ordinary method. For example, the ring-opening polymerization method or addition polymerization method etc. may be employed.

The polysiloxane (A5) used in the present invention is not particularly limited, but preferably a polymer which is obtained by mixing and reacting one or more types of organosilane represented by the following formula (5) may be mentioned.

$$(R^{14})_p\text{—Si—}(OR^{15})_{4-p} \quad (5)$$

In the above formula (5), $R^{14}$ is a hydrogen atom, alkyl group having 1 to 10 carbon atoms, alkenyl group having 2 to 10 carbon atoms, aryl group having 6 to 15 carbon atoms. The plurality of $R^{14}$ may be the same or different. Note that, these alkyl groups, alkenyl groups, and aryl groups may all have substituents. Further, they may be nonsubstituted groups which do not have substituents and may be selected in accordance with the properties of the composition. As specific examples of the alkyl group, a methyl group, ethyl group, n-propyl group, isopropyl group, n-butyl group, t-butyl group, n-hexyl group, n-decyl group, trifluoromethyl group, 2,2,2-trifluoroethyl group, 3,3,3-trifluoropropyl group, 3-glycidoxypropyl group, 2-(3,4-epoxy cyclohexyl) ethyl group, 3-aminopropyl group, 3-mercaptopropyl group, and 3-isocyanatepropyl group may be mentioned. As specific examples of the alkenyl group, a vinyl group, 3-acryloxypropyl group, and 3-methacryloxypropyl group may be mentioned. As specific example of the aryl group, a phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy)pentyl group, and naphthyl group may be mentioned.

Further, in the above general formula (5), $R^{15}$ is a hydrogen atom, alkyl group having 1 to 6 carbon atoms, acyl group having 1 to 6 carbon atoms, aryl group having 6 to 15 carbon atoms, where the plurality of $R^{15}$ may be the same or different. Note that, these alkyl groups and acyl groups may all have substituents. Further, they may be nonsubstituted groups which do not have substituents and may be selected in accordance with the properties of the composition. As specific examples of the alkyl group, a methyl group, ethyl group, n-propyl group, isopropyl group, and n-butyl group may be mentioned. As a specific example of the acyl group, an acetyl group may be mentioned. As a specific example of an aryl group, a phenyl group may be mentioned.

Furthermore, in the above general formula (5), "p" is an integer of 0 to 3. When p=0, the compound becomes tetrafunctional silane, when p=1, it becomes trifunctional silane, when p=2, it becomes bifunctional silane, and when p=3, it becomes monofunctional silane.

As specific examples of an organosilane represented by the above general formula (5), tetramethoxysilane, tetraethoxysilane, tetraacetoxysilane, tetraphenoxysilane, or other tetrafunctional silanes; methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimthoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 2-(3,4-epoxy cyclohexyl)ethyltrimethoxysilane, 3-mercaptopropyltrimethoxysilane, or other trifunctional silanes; dimethyldimethoxysilane, dimethyldiethoxysilane, dimethyldiacetoxysilane, di-n-butyldimethoxysilane, diphenyldimethoxysilane, or other bifunctional silanes; trimethylmethoxysilane, tri-n-butylethoxysilane, or other monofunctional silanes; may be mentioned.

Among these organosilanes, from the viewpoint of the crack resistance or hardness of the obtained resin film, trifunctional silanes are preferably used. These organosilanes may be used alone or may be used as two types or more combined.

The polysiloxane (A5) used in the present invention is obtained by the hydrolysis or partial condensation of the above-mentioned organosilanes. For the hydrolysis and partial condensation, general methods can be used. For example, a solvent, water, and according to need a catalyst are added to the mixture and heated and stirred. During stirring, in accordance with need, distillation may be used to distill off the hydrolysis byproducts (methanol or other alcohol) or condensation byproduct (water).

The binder resin (A) used in the present invention has a weight average molecular weight (Mw) of usually 1,000 to 1,000,000, preferably 1,500 to 100,000, more preferably 2,000 to 30,000 in range.

Further, the binder resin (A) has a molecular weight distribution of a weight average molecular weight/number average molecular weight (Mw/Mn) ratio of usually 4 or less, preferably 3 or less, more preferably 2.5 or less.

The weight average molecular weight (Mw) and molecular weight distribution (Mw/Mn) of the binder resin (A) are values which are found by gel permeation chromatography (GPC) using tetrahydrofuran and other solvents as eluents and as values converted to polystyrene.

(Radiation-Sensitive Compound (B))

The radiation-sensitive compound (B) is a compound able to undergo a chemical reaction by being irradiated by electromagnetic radiation such as ultraviolet rays or electron beams. In the present invention, the radiation-sensitive compound (B) preferably is one in which the alkali solubility of a resin film formed from the radiation-sensitive resin composition can be controlled, in particular preferably uses a photo acid generator.

As such a radiation-sensitive compound (B), for example, an acetophenone compound, triarylsulfonium salt, and an azide compound such as a quinone diazide compound may be mentioned, but preferably it is an azide compound, particularly preferably a quinone diazide compound.

As a quinone diazide compound, for example, an ester compound of a quinone diazide sulfonic acid halide and a compound which has a phenolic hydroxyl group can be used. As specific examples of the quinone diazide sulfonic acid halide, 1,2-naphthoquinone diazide-5-sulfonic acid chloride, 1,2-naphthoquinone diazide-4-sulfonic acid chloride, 1,2-benzoquinone diazide-5-sulfonic acid chloride, etc. may be mentioned. As typical examples of a compound which has a phenolic hydroxyl group, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, etc. may be mentioned. As other compounds which have phenolic hydroxyl groups, 2,3,4-trihydroxybenzophenone, 2,3,4,4'-tetrahydroxybenzophenone, 2-bis(4-hydroxyphenyl)propane, tris(4-hydroxyphenyl)methane, 1,1,1-tris(4-hydroxy-3-methylphenyl)ethane, 1,1,2,2-tetrakis(4-hydroxyphenyl)ethane, oligomers of novolac resins, oligomers obtained by copolymerization of a compound which has one or more phenolic hydroxyl groups and dicyclopentadiene, etc. may be mentioned.

Further, as the photo acid generator, in addition to a quinone diazide compound, a known one such as an onium salt, halogenated organic compound, α,α'-bis(sulfonyl) dizaomethane-based compound, α-carbonyl-α'-sulfonyldiazomethane-based compound, sulfone compound, organic acid ester compound, organic acid amide compound, organic acid imide compound, etc. may be used.

These radiation-sensitive compounds may be used alone or as two types or more combined.

In the radiation-sensitive resin composition of the present invention, the content of the radiation-sensitive compound (B) is preferably 10 to 100 parts by weight with respect to 100 parts by weight of the binder resin (A), more preferably 15 to 70 parts by weight, still more preferably 25 to 50 parts by weight. By making the content of the radiation-sensitive compound (B) this range, it is possible to make the resin film obtained using the radiation-sensitive resin composition of the present invention better in adhesion in development and low in hygroscopicity.

(Cross-Linking Agent (C))

The radiation-sensitive resin composition of the present invention contains a cross-linking agent (C) in addition to the above-mentioned binder resin (A) and radiation-sensitive compound (B).

The cross-linking agent (C) used in the present invention is one forming a cross-linked structure between the cross-linking agent molecules by heat or one reacting with the binder resin (A) to form a cross-linked structure between the resin molecules. Specifically, a compound having two or more reactive groups may be mentioned. As such a reactive group, for example, an amino group, carboxy group, hydroxy group, epoxy group, isocyanate group, etc. may be mentioned. More preferably, it is an amino group, epoxy group, or isocyanate group, still more preferably it is an amine group or epoxy group. An epoxy compound having an epoxy group is particularly preferable. Further, as an epoxy group, an end epoxy group or alicyclic epoxy group is preferable, while an alicyclic epoxy group is more preferable.

The molecular weight of the cross-linking agent (C) is not particularly limited, but is usually 100 to 100,000, preferably 120 to 50,000, more preferably 150 to 10,000. The cross-linking agent can be used alone or as two types or more combined.

As specific examples of the cross-linking agent (C), aliphatic polyamines such as hexamethylenediamine; aromatic polyamines such as 4,4'-diaminodiphenyl ether, and diaminodiphenylsulfone; azides such as 2,6-bis(4'-azidobenzal)cyclohexanone and 4,4'-diazidodiphenylsulfone; polyimides such as nylon, polyhexamethylenediamine terephthalamide, and polyhexamethylene isophthalamide; melamines which may have an alkoxyalkyl group, methylol group, imino group, etc. such as N,N,N',N',N",N"-(hexaalkoxyalkyl)melamine (Cymel series and Mycoat series such as product name "Cymel 303, Cymel 325, Cymel 370, Cymel 232, Cymel 235, Cymel 272, Cymel 212, and Mycoat 506" (above, made by Cytec Industries) and product name "Nikalac MW-100LM", made by Sanwa Chemical); glycolurils which may have a methylol group or imino group such as N,N',N",N'"-(tetraalkoxyalkyl)glycoluril (Cymel series such as product name "Cymel 1170" (above, made by Cytec industries)); acrylate compounds such as ethylene glycol di(meth)acrylate; alkoxyalkyl-substituted phenol compounds such as 2,6-dimethoxymethyl-4-t-butylphenol and 2,6-dimethoxymethyl-p-cresol; tetraalkoxyalkyl-substituted biphenyl compounds such as 3,3',5,5'-tetramethoxymethyl-4,4'-dihydroxybiphenyl (for example, product name "TMOM-BP", made by Honshu Chemical Industry) and 1,1-bis[3,5-di(methoxymethyl)-4-hydroxyphenyl]-1-phenylethane; hexaalkoxyalkyl-substituted triphenyl compounds such as hexamethoxymethyl-substituted compounds such as 4,4',4"-(ethylidene)trisphenol (for example, product name "HMOM-TPHAP-GB", made by Honshu Chemical Industry); isocyanate-based compounds such as a hexamethylene diisocyanate-based polyisocyanate, isophoron diisocyanate-based polyisocyanate, tolylene diisocyanate-based polyisocyanate, and hydrated diphenylmethane diisocyanate; 1,4-di-(hydroxymethyl)cyclohexane, 1,4-di-(hydroxymethyl) norbornane; 1,3,4-trihydroxycyclohexane; epoxy compounds such as a bisphenol A type epoxy resin, bisphenol F type epoxy resin, phenol novolac type epoxy resin, cresol novolac type epoxy resin, polyphenol type epoxy resin, cyclic aliphatic epoxy resin, aliphatic glycidyl ether, and epoxyacrylate polymer may be mentioned.

As specific examples of epoxy compounds, an epoxy compound having an alicyclic structure such as a 1,2-epoxy-4-(2-oxiranyl)cyclohexane adduct of 2,2-bis(hydroxymethyl)1-butanol (15-functional alicyclic epoxy resin having cyclohexane structure and end epoxy group, product name "EHPE3150", made by Daicel Chemical Industries), epoxylated 3-cyclohexene-1,2-dicarboxylic acid bis(3-cyclohexenylmethyl)-modified ε-caprolactone (aliphatic cyclic trifunctional epoxy resin, product name "Epolide GT301", made by Daicel Chemical Industries), epoxylated butanetetracarboxylic acid tetrakis (3-cyclohexenylmethyl)-modified ε-caprolactone (aliphatic cyclic tetrafunctional epoxy resin, product name "Epolide GT401", made by Daicel Chemical Industries), 3,4-epoxy cyclohexenylmethyl-3',4'-epoxy cyclohexenecarboxylate (product names "Celloxide 2021" and "Celloxide 2021P", made by Daicel Chemical Industries), 1,2:8,9-diepoxylimonene (product name "Celloxide 3000", made by Daicel Chemical Industries), and 2-(3,4-epoxycyclohexyl)ethyltrimethoxysilane (product name "Z-6043", made by Dow Corning Toray); and an epoxy compound not having an alicyclic structure such as a bisphenol A type epoxy compound (product name "jER 825", "jER 827", "jER 828", "jER YL980", "jER 1001", "jER 1003", made by Mitsubishi Chemical, product name "EPICLON 840", "EPICLON 850", made by DIC), bisphenol F type epoxy compound (product name "jER 806", "jER 807", "jER YL983U", "jER 4004P", "jER 4005P" made by Mitsubishi Chemical, product name "EPICLON 830", "EPICLON 835", made by DIC), a 1,2-epoxy-4-(2-oxiranyl) cyclohexane adduct of 2,2-bis(hydroxymethyl)-1-butanol (product name "EHPE3150", mode by Daicel Chemical Industries), hydrated bisphenol A type epoxy compound (product name "jER YX8000", "jER YX8034", made by Mitsubishi Chemical, product name "ST-3000", made by Nippon Steel & Sumitomo Metal), long chain bisphenol A type epoxy resin (product name "EXA-4816", "EXA-4850-150", and "EXA-4850-1000", made by DIC), EO-modified bisphenol A type epoxy compound (product name "Adeka Resin EP-4000L" and "Adeka Resin EP-4010L", made by Adeka), phenol novolac type polyfunctional epoxy compound (product name "jER 152" and "jER 154", made by Mitsubishi Chemical), a polyfunctional epoxy compound having a naphthalene structure such as 1,6-bis(2,3-epoxypropan-1-yloxy)naphthalene (product name "HP-4032", "HP-4032D", and "HP-4700", made by DIC), tris(hydroxyphenyl)methane type epoxy resin (product name "jER 1032S", made by Mitsubishi Chemical), tetrakis(hydroxyphenyl)ethane type epoxy resin (product name "jER 1031S", made by Mitsubishi Chemical), anthraquinone type epoxy compound (product name "jER YX8800", made by Mitsubishi Chemical), dicyclopentadiene dimethanol diglycidyl ether (product name "Adeka Resin EP-4000L", "Adeka Resin EP-4088L", made by Adeka), glycidyl amine type epoxy resin (product name "jER630", made by Mitsubishi Chemical, product name "TETRAD-C", "TETRAD-X", made by Mitsubishi as Chemical), chain type alkyl polyfunctional epoxy compound (product name "SR-TMP", made by Sakamoto Yakuhin Kogyo), polyfunctional epoxy polybutadiene (product name "Epolide PB3600", made by Daicel Chemical Industries), glycidyl polyether compound of glycerin (product name "SR-GLG", made by Sakamoto Yakuhin Kogyo), diglycerin polyglycidyl ether compound (product name "SR-DGE", made by Sakamoto Yakuhin Kogyo), polyglycerin polyglycidyl ether compound (product name "SR-4GL", made by Sakamoto Yakuhin Kogyo), and γ-glycidoxypropyl-trimethylsilane (product name "Z6040", made by Dow Corning Toray) may be mentioned.

Among epoxy compounds as well, a polyfunctional epoxy compound having two or more epoxy groups is preferable, while a polyfunctional epoxy compound having two to four epoxy groups is more preferable. Further, the epoxy compound is not particularly limited in epoxy equivalent, but one with an epoxy equivalent of 450 or less is preferable. Note that the lower limit of the epoxy equivalent is not particularly limited, but is preferably 80 or more. Furthermore, as the epoxy compound, one with a softening point of 30° C. or less is preferable, while one with a softening point of 25° C. or less is more preferable. Note that, the lower limit of the softening point of the epoxy-based cross-linking agent (C) is not particularly limited. So long as the agent is liquid in state at ordinary temperature (25° C.), the softening point is not particularly limited.

The total chlorine amount of the epoxy compound used in the present invention is preferably 1500 ppm or less, more preferably 800 ppm or less, still more preferably 300 ppm or less. If using an epoxy compound with the total chlorine amount in this range, there is an excellent effect in terms of reduction of corrosion or migration of interconnects.

Note that, when using an epoxy compound as a cross-linking agent (C), from the viewpoint of better improving the low hygroscopicity, it is preferable to jointly use, together with the epoxy compound, a compound having an alkoxyalkyl group such as melamine having an alkoxyalkyl group, dialkoxyalkyl-substituted phenol compound, tetraalkoxyalkyl-substituted biphenyl compound, and hexaalkoxyalkyl-substituted triphenyl compound. In particular, it is more preferable to jointly use a compound having a methoxymethyl group.

In the radiation-sensitive resin composition of the present invention, the content of the cross-linking agent (C) is preferably 5 to 80 parts by weight with respect to 100 parts by weight of the binder resin (A), more preferably 10 to 75 parts by weight, still more preferably 15 to 70 parts by weight. If the cross-linking agent (C) is too great or too small, the development characteristics are liable to deteriorate.

(Silane Coupling Agent (D))

Further, the radiation-sensitive resin composition of the present invention contains a silane coupling agent (D) represented by the following general formula (1) in addition to the above binder resin (A), radiation-sensitive compound (B), and cross-linking agent (C).

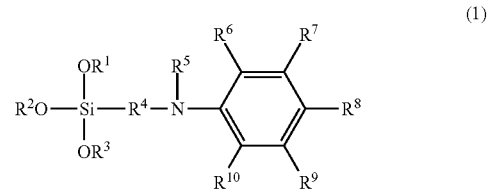

(1)

(In the general formula (1), $R^1$ to $R^3$ respectively independently are a monovalent alkyl group having 1 to 5 carbon atoms, $R^4$ is a divalent alkylene group having 1 to 10 carbon atoms, $R^5$ is a hydrogen atom or monovalent alkyl group having 1 to 5 carbon atoms, and $R^6$ to $R^{10}$ are a hydrogen atom or monovalent alkyl group having 1 to 5 carbon atoms.)

In the present invention, by mixing a silane coupling agent (D) represented by the general formula (1) together with the above-mentioned cross-linking agent (C), it is possible to make the radiation-sensitive resin composition excellent in storage stability while making the obtained resin film excellent in adhesion in development (that is, adhesion at time of patterning by development) and low in hygroscopicity.

Note that, in the general formula (1), $R^1$ to $R^3$ respectively independently are a monovalent alkyl group having 1 to 5 carbon atoms, preferably a monovalent alkyl group having 1 to 3 carbon atoms. As specific examples of $R^1$ to $R^3$, a methyl group, ethyl group, n-propyl group, n-butyl group, n-pentyl group, n-hexyl group, n-heptyl group, n-octyl group, etc. may be mentioned. Among these, a methyl group and ethyl group are preferable, while a methyl group is more preferable.

Further, in the general formula (1), $R^4$ is a divalent alkylene group having 1 to 10 carbon atoms, preferably a divalent alkylene group having 2 to 4 carbon atoms. As specific examples of $R^4$, a methylene group, ethylene group, propylene group, isopropylene group, etc. may be mentioned. Among these as well, a propylene group is preferable.

Furthermore, in the general formula (1), $R^5$ is a hydrogen atom or monovalent alkyl group having 1 to 5 carbon atoms, preferably a hydrogen atom, $R^6$ to $R^{10}$ are a hydrogen atom or monovalent alkyl group having 1 to 3 carbon atoms, preferably a hydrogen atom. Note that as specific examples of the case where $R^5$ to $R^{10}$ are a monovalent alkyl group, one illustrated in the above $R^1$ to $R^3$ etc. may be mentioned.

As specific examples of the compound represented by the general formula (1), N-phenylaminomethyltrimethoxysilane, N-phenylaminomethyltriethoxysilane, N-phenyl-2-aminoethyltrimethoxysilane, N-phenyl-2-aminoethyltriethoxysilane, N-phenyl-3-aminopropyltrimethoxysilane, N-phenyl-3-aminopropyltriethoxysilane, N-phenyl-4-aminobutyltrimethoxysilane, N-phenyl-4-aminobutyltriethoxysilane, etc. may be mentioned. These may be used respectively alone or as two types or more combined.

In the radiation-sensitive resin composition of the present invention, the content of the silane coupling agent (D) is preferably 0.001 to 100 parts by weight with respect to 100 parts by weight of the binder resin (A), more preferably 0.01 to 50 parts by weight, still mere preferably 0.1 to 20 parts by weight. By making the content of the silane coupling agent (D) the above range, the effect of addition can be raised more.

(Phenol Resin (E))

Further, the radiation-sensitive resin composition of the present invention may further contain a phenol resin (E) in addition to the above-mentioned components. The phenol resin (E) is used for better improving the adhesion in development of the resin film formed from the radiation-sensitive resin composition of the present invention.

The phenol resin (E) is not particularly limited, but a novolac type phenol resin obtained by condensation or cocondensation of phenols such as phenol, cresol, resorcine, catechol, bisphenol A, bisphenol F, phenylphenol, and aminophenol and/or naphthols such as α-naphthol, β-naphthol, and dihydroxynaphthalene and a compound having an aldehyde group such as formaldehyde, benzaldehyde, and salicylaldehyde in the presence of an acidic catalyst; an aralkyl type phenol resin such as a phenol-aralkyl resin, biphenylene type phenol-aralkyl resin, and naphthol-aralkyl resin synthesized from phenols and/or naphthols and dimethoxy-p-xylene or bis(methoxymethyl)biphenyl; a dicyclopentadiene type phenol resin such as a dicyclopentadiene type phenol novolac resin and dicyclopentadiene type naphthol novolac resin synthesized by copolymerization of phenols and/or naphthols and dicyclopentadiene; a triphenylmethane type phenol resin; a terpene-modified phenol resin; p-xylene and/or m-xylene-modified phenol resin; melamine-modified phenol resin; cyclopentadiene-modified phenol resin; biphenyl type phenol resin; phenol resin obtained by copolymerization of two types or more of these; etc. may be mentioned. These may be used respectively alone or as two types or more combined.

Among these as well, from the viewpoint of being able to reduce the water absorption rate of the obtained cured film, a phenol-aralkyl resin is preferable. Among the phenol-aralkyl resins, a compound represented by the following general formula (6) is particularly preferable.

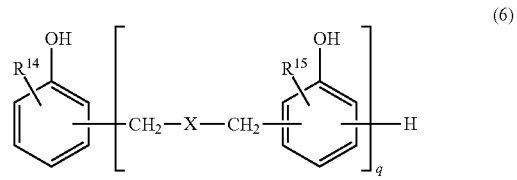

(In the general formula (6), $R^{14}$ and $R^{15}$ respectively independently are a hydrogen atom or alkyl group having 1 to 12 carbon atoms, preferably a hydrogen atom or methyl group. "q" is a positive number of 1 to 50, preferably a positive number of 1 to 25. Further, in the above formula, X is any group represented by the following general formulas (7) to (9), preferably a group represented by the following general formula (8). Further, the position of the substituents on the aromatic ring may be any positions. For example, the substituents may be present at any of the o-position, m-position, and p-position.)

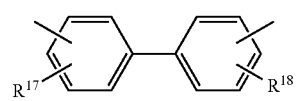

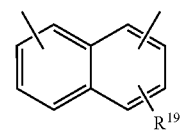

(In the general formulas (7) to (9), $R^{16}$ to $R^{19}$ respectively independently are a hydrogen atom or alkyl group having 1 to 12 carbon atoms, preferably a hydrogen atom or methyl group. Further, the position of the substituents on the aromatic ring may be any positions. For example, the substituents may be present at any of the o-position, m-position, and p-position.)

In the radiation-sensitive resin composition of the present invention, the content of the phenol resin (E) is preferably 1 to 100 parts by weight with respect to 100 parts by weight of the binder resin (A), more preferably 2 to 80 parts by weight, still more preferably 3 to 50 parts by weight. By making the content of phenol resin (E) the above range, it is possible to enhance more the effect of improvement of the adhesion in development.

(Other Compounding Agents)

Further, the radiation-sensitive resin composition of the present invention may further contain a solvent. The solvent is not particularly limited, but one known as a solvent of a resin composition, for example, acetone, methylethylketone, cyclopentanone, 2-hexanone, 3-hexanone, 2-heptanone, 3-heptanone, 4-heptanone, 2-octanone 3-octanone, 4-octanone, or other straight chain ketones; n-propyl alcohol, isopropyl alcohol, n-butyl alcohol, cyclohexanol, or other alcohols; ethyleneglycol dimethyl ether, ethyleneglycol diethyl ether, dioxane, or other ethers; ethyleneglycol monomethyl ether, ethyleneglycol monoethyl ether, or other alcohol ethers; propyl formate, butyl formate, propyl acetate, butyl acetate, methyl propionate, ethyl propionate, methyl butyrate, ethyl butyrate, methyl lactate, ethyl lactate, or other esters; cellosolve acetate, methylcellosolve acetate, ethylcellosolve acetate, propylcellosolve acetate, butylcellosolve acetate, or other cellosolve esters; propyleneglycol, propyleneglycol monomethyl ether, propylene glycol monomethyl ether acetate, propylene glycol monoethyl ether acetate, propylene glycol monobutyl ether, or other propylene glycols; diethylene glycol monomethyl ether, diethylene glycol monoethyl ether, diethylene glycol dimethyl ether, diethylene glycol diethyl ether, diethylene glycol methylethyl ether, or other diethylene glycols; γ-butyrolactone, γ-valerolactone, γ-caprolactone, γ-caprylolactone, or other saturated γ-lactones; trichloroethylene or other halogenated hydrocarbons; toluene, xylene, or other aromatic hydrocarbons; dimethylacetoamide, dimethylformamide, N-methylacetoamide, or other polar solvents; etc. may be mentioned. These solvents may be used alone or as two types or more combined. The content of the solvent is preferably 10 to 10000 parts by weight with respect to 100 parts by weight of the binder resin (A), more preferably 50 to 5000 parts by weight, furthermore preferably 100 to 1000 parts by weight in range. Note that, when the resin composition is made to include a solvent, the solvent is normally removed after forming the cured film.

Further, the radiation-sensitive resin composition of the present invention may contain, as desired in a range where the effect of the present invention is not obstructed, another compounding agent such as a silane coupling agent other than the above silane coupling agent (D), a compound having an acidic group or thermally latent acidic group, a surfactant, sensitizer, photostabilizer, defoamer, pigment, dye, and filler. Among these, for example a compound having an acidic group or thermally latent acidic group such as described in Japanese Patent Publication No. 2014-29766A may be used. Further, a surfactant, sensitizer, and photostabilizer such as described in Japanese Patent Publication No. 2011-75609A may be used.

As the silane coupling agent other than the above-mentioned silane coupling agent (D), for example, a silane coupling agent having a carboxyl group such as trimethoxysilyl benzoic acid; a silane coupling agent having a methacryloyl group such as γ-methacryloxypropyltrimethoxysilane, and γ-methacryloxypropyltriethoxysilane; a silane coupling agent having an isocyanate group such as γ-isocyanate propyltrimethoxysilane, and γ-isocyanate propyltriethoxysilane; a silane coupling agent having an epoxy group such as γ-glycidoxypropyltrimethoxysilane, γ-glycidoxypropyltriethoxysilane, β-(3,4-epoxy cyclohexyl)ethyltrimethoxysilane, and β-(3,4-epoxy cyclohexyl)ethyltriethoxysilane; etc. may be mentioned. Among these as well, a silane coupling agent having an epoxy group is suitable.

In the radiation-sensitive resin composition of the present invention, the content of the silane coupling agent other than the silane coupling agent (D) is preferably 0.001 to 100 parts by weight with respect to 100 parts by weight of the binder resin (A), more preferably 0.01 to 50 parts by weight, still more preferably 0.1 to 20 parts by weight.

The method of preparing the radiation-sensitive resin composition of the present invention is not particularly limited. The components forming the radiation-sensitive resin composition may be mixed by a known method.

The method of mixing is not particularly limited, but mixing solutions or dispersions obtained by dissolving or dispersing the components forming the radiation-sensitive resin composition in a solvent is preferable. Due to this, the radiation-sensitive resin composition is obtained in the form of a solution or dispersion.

The method of dissolving or dispersing the components forming the radiation-sensitive resin composition may be an ordinary method. Specifically, this may be performed by stirring using a physical stirrer and magnetic stirrer, a high speed homogenizer, disperser, planetary stirrer, twin screw stirrer, ball mill, triple roll, etc. Further, it is possible to dissolve or disperse the components in a solvent, then, for example, filter the result using a filter with a pore size of 0.5 μm or so.

(Electronic Device)

Next, the electronic device of the present invention will be explained. The electronic device of the present invention has a resin film comprised of the above-mentioned radiation-sensitive resin composition of the present invention.

As the electronic device of the present invention, for example, one configured by a board on which a semiconductor device is mounted may be mentioned. Giving one example, an active matrix board, organic EL device board, integrated circuit device board, solid imaging device board, etc. may be mentioned. The resin film comprised of the radiation-sensitive resin composition of the present invention can be suitably used as an insulating film for redistribution layer use used for a redistribution layer (RDL) formed on a surface protective film of a device forming such an electronic device. In particular, the resin film comprised of the radiation-sensitive resin composition of the present invention enables the efficient formation of fine patterns of resin film by development since it is excellent in adhesion in development. Therefore, it is suitable for applications of resin films of redistribution layers for which finer interconnects have been sought in recent years. Furthermore, the resin film comprised of the radiation-sensitive resin composition of the present invention is low in hygroscopicity, so increased fineness of the redistribution layer can be realized with a high reliability.

In the electronic device of the present invention, the method of forming the resin film is not particularly limited. For example, a method such as the coating method or film lamination method can be used.

The coating method is, for example, the method of coating a radiation-sensitive resin composition, then drying by heating to remove the solvent. As the method of coating the radiation-sensitive resin composition, for example, various methods such as spray method, spin coat method, roll coat method, die coat method, doctor blade method, spin coat method, bar coat method, screen print method, and inject method can be employed. The heating and drying conditions differ according to the type and ratio of the ingredients, but are usually 30 to 150° C., preferably 60 to 120° C. usually for 0.5 to 90 minutes, preferably 1 to 60 minutes, more preferably 1 to 30 minutes.

The film lamination method is a method comprising coating a radiation-sensitive resin composition on a resin film, metal film or other substrate for forming B-stage film, then heating and drying it to remove the solvent to obtain the B-stage film, then laminating this B-stage film. The heating and drying conditions may be suitably selected in accordance with the types and ratios of content of the ingredients, but the heating temperature is usually 30 to 150° C. and the heating time is usually 0.5 to 90 minutes. The film lamination may be performed by using a press laminator, press, vacuum laminator, vacuum press, roll laminator, and other press bonding machines.

The thickness of the resin film is not particularly limited, but is preferably 0.1 to 100 μm, more preferably 0.5 to 50 μm, still more preferably 0.5 to 30 μm.

Next, the thus formed resin film is patterned by desired patterns. As the method of patterning the resin film, for example, the method of using the radiation-sensitive resin composition of the present invention to form a resin film before patterning, irradiating activating radiation on the resin film before patterning to form latent image patterns, then bringing the resin film having the latent image patterns into contact with a developer to manifest the patterns, etc. may be mentioned.

The active radiation is not particularly limited so long as able to activate the radiation-sensitive compound (B) contained in the radiation-sensitive resin composition and change the alkali solubility of the radiation-sensitive resin composition containing the radiation-sensitive compound (B). Specifically, ultraviolet light, g-rays or i-rays and other single wavelength ultraviolet light, KrF excimer laser light, ArF excimer laser light, and other light, beams; electron beams and other particle beams; etc. may be used. As the method of selectively radiating active radiation in a pattern manner to form latent patterns, an ordinary method may be used. For example, the method of using a reduced projection exposure apparatus etc. to irradiate ultraviolet light, g-rays, i-rays, KrF excimer laser light, ArF excimer laser light, and other light beams through a desired mask pattern or the method of using an electron beam or other particle beam for lithography etc. may be used. When using light beams as active radiation, single wavelength light or mixed wavelength light may be used. The irradiation conditions may be suitably selected in accordance with the active radiation used, but, for example, when using wavelength 200 to 450 nm light beams, the amount of irradiation is normally 10 to 5,000 $mJ/cm^2$, preferably 50 to 1,500 $mJ/cm^2$ in range and is determined in accordance with the irradiation time and illuminance. After irradiating the active radiation in this way, in accordance with need, the resin film is heat treated at 60 to 130° C. or so in temperature for 1 to 2 minutes or so.

Next, the latent patterns which are formed in the resin film before patterning are developed to bring them out. As the developing solution, normally aqueous solutions of alkali compounds may be used. As alkali compounds, for example, alkali metal salts, amines, and ammonium salts may be used. The alkaline compounds may be inorganic compounds or organic compounds. As specific examples of these compounds, sodium hydroxide, potassium hydroxide, sodium carbonate, sodium silicate, metasodium silicate, and other alkali metal salts; ammonia water; ethylamine, n-propylamine, and other primary amines; diethylamine, di-n-propylamine, and other secondary amines; triethylamine, methyldiethylamine, and other tertiary amines; tetramethylammonium hydroxide, tetraethylammonium hydroxide, tetrabutylammonium hydroxide, choline, and other quaternary ammonium salts; dimethylethanolamine, triethanolamine, and other alcohol amines; pyrrol, piperidine, 1,8-diazabicyclo[5.4.0]undec-7-ene, 1,5-diazabicyclo[4.3.0]non-5-ene, N-methylpyrrolidone, and other cyclic amines; etc. may be mentioned. These alkali compounds may be respectively used alone or as two types or more combined.

As the aqueous medium of the alkali aqueous solution, water; methanol, ethanol, and other water soluble organic solvents may be used. The alkali aqueous solution may have a surfactant etc. added in a suitable amount.

As the method for bringing the developing solution in contact with the resin film which has the latent patterns, for example, the puddle method, spray method, dipping method, and other methods may be used. The development conditions are suitably selected as normally 0 to 100° C., preferably 5 to 55° C., more preferably 10 to 30° C. and normally 30 to 180 seconds.

The resin film formed with the targeted patterns in this way may, in accordance with need, be rinsed by a rinse solution to remove the developer residue. After the rinsing, the remaining rinse solution is removed by compressed air or compressed nitrogen.

Furthermore, in accordance with need, to deactivate the radiation-sensitive compound (B) contained in the radiation-sensitive resin composition, it is possible to irradiate the entire surface of the electronic device with activating radiation. The activating radiation can be irradiated utilizing the method illustrated for formation of the above latent patterns. The resin film may be heated at the same time as irradiation or after irradiation. As the heating method, for example, the method of heating the electronic device by a hot plate or in an oven may be mentioned. The temperature is usually 80 to 300° C., preferably 100 to 200° C. in range.

Next, the thus formed resin film is patterned, then cross-linked. Such cross-linking is usually performed by heating, but the method may be suitably selected in accordance with the type of the cross-linking agent (C) contained in the radiation-sensitive resin composition. The heating method may be one using, for example, a hot plate, oven, etc. The heating temperature is usually 180 to 250° C., while the heating time is suitably selected according to the area or thickness of the resin film or the equipment used etc. For example, when using a hot plate, the time is usually 5 to 60 minutes, while when using an oven, the time is usually 30 to 90 minutes in range. The heating may be performed, in accordance with need, in an inert gas atmosphere. As the inert gas, one not containing oxygen and not causing oxidation of the resin film, for example, nitrogen, argon, helium, neon, xenon, krypton, etc., may be mentioned. Among these as well, nitrogen and argon are preferable, in particular nitrogen is preferable. In particular, an inert gas having an oxygen content of 0.1 vol % or less, preferably 0.01 vol % or less, particularly nitrogen gas, is preferable. These inert gases may be used respectively alone or as two types or more in combination.

An electronic device including a patterned resin film can be produced in this way.

EXAMPLES

Below, examples and comparative examples will be given to explain the present invention more specifically. In the examples, "parts" are based on weight unless otherwise indicated.

Note that, the definitions of the different characteristics and methods of evaluation were as follows.

(Storage Stability)

The radiation-sensitive resin composition prepared in each example and comparative example was inserted into a polyethylene container and shaken by a shaker for 3 hours, then was visually examined for the state of the radiation-sensitive resin composition. The following criteria were used to evaluate the storage stability.

A: components forming radiation-sensitive resin composition completely dissolved C: turbidity or precipitation occurred (Adhesion in Development)

On a silicon substrate, a radiation-sensitive resin composition prepared in each of the examples and comparative examples was spin coated and prebaked using a hot plate at 120° C. for 2 minutes to form a thickness 3.0 μm resin film.

Next, to pattern the resin film, a mask able to form 3.0 μm contact holes was used for an exposure process while changing the amount of exposure from 50 mJ/cm$^2$ to 350 mJ/cm$^2$. In the exposure process, a high pressure mercury lamp emitting light of the wavelength of g-rays (436 nm), h-rays (405 nm), and i-rays (365 nm) was used. Next, a 2.38 wt % tetramethylammonium hydroxide aqueous solution was used for development at 25° C. for 100 seconds, then the sample was rinsed by ultrapure water for 30 seconds to thereby obtain a laminate including a resin film having contact holes and a silicone substrate. Further, an optical microscope was used to examine the contact hole parts of the obtained laminate and measure the lengths of the contact hole diameters of the resin film of the parts exposed by different exposures. Next, an approximation curve was prepared from the relationship of the amounts of exposure and the contact hole diameters of the resin film formed at the corresponding amounts of exposure, the amounts of exposure at the time of contact holes of 3.0 μm were calculated, and the obtained amounts of exposure were calculated as exposure sensitivity.

Further, the sane procedure was followed as above to form a thickness 3.0 μm resin film on a silicon substrate, use a mask able to form 3.0 μm/3.0 μm lines and spaces, irradiate an amount of exposure light corresponding to the above calculated exposure sensitivity, then develop this by a 2.38 wt % tetramethylammonium hydroxide aqueous solution for 100 seconds and rinse it by ultrapure water for 30 seconds to thereby obtain a laminate comprised of a resin film having lines and spaces and a silicon substrate. The line and space parts of the obtained laminate were examined and the presence of rising and peeling of lines was checked for and the result evaluated by the following criteria.

A: no rising or peeling of lines
C: rising or peeling of lines observed (Amount of Water Absorption)

On a silicon wafer, a radiation-sensitive resin composition prepared in each of the examples and comparative examples was spin coated and prebaked using a hot plate at 120° C. for 2 minutes to form a resin film. Next, this was heated in nitrogen at 230° C. for 1 hour to thereby obtain a resin film-coated silicon wafer formed with a thickness 3 μm resin film. Further, the obtained silicon wafer with resin film was placed in a highly accelerated stress test apparatus (HAST apparatus) and allowed to stand at 130° C. in a 98% RH environment for 200 hours.

Further, a silicon wafer with the resin film before the highly accelerated lifetime test and after the highly accelerated lifetime test was used to measure the amount of water absorption. Specifically, each silicon wafer with resin film was raised by 60° C./min to 300° C. using a thermal desorption spectrometer (TDS, made by ESCO, Model No. "WA1000S/W") and held there for 30 minutes to measure the amount of water absorption per unit volume. Further, based on the obtained measurement results, the amount of water absorption of the resin film was calculated in accordance with the below formula. The smaller the amount of water absorption, the higher the insulating ability that can be maintained even under a high temperature and high moisture and therefore the more improved the reliability that can be judged.

Amount of water absorption=Amount of moisture of resin film after highly accelerated lifetime test−amount of moisture of resin film before highly accelerated lifetime test Synthesis Example 1

<Preparation of Cyclic Olefin Polymer (A-1)>

100 parts of a monomer mixture including 40 mol % of N-phenyl-bicyclo[2.2.1]hept-5-ene-2,3-dicarboxyimide (NBPI) and 60 mol % of 4-hydroxycarbonyltetracyclo[6.2.1.1$^{3,6}$.0$^{2,7}$]dodec-9-ene (TCDC), 2.0 parts of 1,5-hexadiene, 0.02 part of (1,3-dimesitylimidazolin-2-ylidene) (tricyclohexylphosphine)benzylideneruthenium dichloride (synthesized by method described in Org. Lett., vol. 1, page 953, 1999), and 200 parts of diethylene glycol ethyl methyl ether were charged into a nitrogen-substituted glass pressure resistant reactor. The mixture was stirred while causing a reaction at 80° C. for 4 hours to obtain a polymerization reaction solution.

Further, the obtained polymerization reaction solution was placed in an autoclave and stirred at 150° C. under a hydrogen pressure of 4 MPa for 5 hours to cause a hydrogenation reaction and obtain a polymer solution containing a cyclic olefin polymer (A-1). The polymerization conversion rate of the obtained cyclic olefin polymer (A-1) was 99.7%, the weight average molecule weight converted to polystyrene was 7,150, the number average molecular weight was 4,690, the molecular weight distribution as 1.52, and the hydrogenation rate was 99.7%. Further, the solid content concentration of the polymer solution of the obtained cyclic olefin polymer (A-1) was 34.4 wt %.

Example 1

A binder resin (A) comprised of 291 parts of a polymer solution of the cyclic olefin polymer (A-1) obtained in Synthesis Example 1 (100 parts as a cyclic olefin polymer (A-1)), a radiation-sensitive compound (B) comprised of 35 parts of a condensate of 4,4'-[1-[4-[1-[4-hydroxyphenyl]-1-methylethyl]phenyl]ethylidene]bisphenol (1.0 mol) and 1,2-napthoquinonediazide-5-sulfonic acid chloride (2.5 mol), a cross-linking agent (C) comprised of 30 parts of a 1,2-epoxy-4-(2-oxiranyl)cyclohexane adduct of 2,2-bis(hydroxymethyl)1-butanol (15-functional alicyclic epoxy resin having cyclohexane structure and end epoxy group, product name "EHPE3150", made by Daicel Chemical Industries, total chlorine amount 25 ppm or less), a silane coupling agent (D) comprised of 1 part of N-phenyl-3-aminopropyltrimethoxysilane (product name "KBM-573", Shin-Etsu Chemical), and a solvent comprised of 160 parts of ethylene glycol dimethylether were mixed and made to dissolve, then the solution was filtered by a pore size 0.45 μm polytetrafluoroethylene filter to prepare a radiation-sensitive resin composition.

Further, the above obtained radiation-sensitive resin composition was used to evaluate and measure the storage stability, adhesion in development, and amount of water absorption. The results are shown in Table 1.

Example 2

Except for using a cross-linking agent (C) comprised of 50 parts of epoxylated butane tetracarboxylic acid tetrakis (3-cyclohexenylmethyl)-modified ε-caprolactone (aliphatic cyclic tetrafunctional epoxy resin, product name "Epolide GT401", made by Daicel Chemical Industries, total chlorine amount 25 ppm or less) instead of 30 parts of a 1,2-epoxy-4-(2-oxiranyl)cyclohexane adduct of 2,2-bis(hydroxymethyl)1-butanol and further adding a cross-linking agent (C) comprised of 10 parts of hexamethoxymethylmelamine (product name "Nikalac MW-100LM", made by Sanwa Chemical) in Example 1, the same procedure was followed as in Example 1 to prepare a radiation-sensitive resin composition and the same procedure was followed to measure and evaluate it. The results are shown in Table 1.

Example 3

Except for changing the amount of N-phenyl-3-aminopropyltrimethoxysilane from 1 part to 0.5 part in Example 2, the same procedure was followed as in Example 2 to prepare a radiation-sensitive resin composition and the same procedure was followed to measure and evaluate it. The results are shown in Table 1.

Example 4

Except for changing the amount of N-phenyl-3-aminopropyltrimethoxysilane from 1 part to 5 parts in Example 2, the same procedure was followed as in Example 2 to prepare a radiation-sensitive resin composition and the same procedure was followed to measure and evaluate it. The results are shown in Table 1.

Example 5

Except for further adding 15 parts of hexamethoxymethylmelamine (product name "Nikalac MW-100LM", made by Sanwa Chemical) and 1 part of γ-glycidoxypropyltrimethylsilane (product name "Z6040", made by Dow Corning Toray) in Example 1, the same procedure was followed as in Example 1 to prepare a radiation-sensitive resin composition and the same procedure was followed to measure and evaluate it. The results are shown in Table 1.

Example 6

Except for changing the amount of the epoxylated butanetetracarboxylic acid tetrakis(3-cyclohexenylmethyl)-modified ε-caprolactone from 50 parts to 30 parts and the amount of hexamethoxymethylmelamine from 10 parts to 15 parts in Example 2, the same procedure was followed as in Example 2 to prepare a radiation-sensitive resin composition and the same procedure was followed to measure and evaluate it. The results are shown in Table 1.

Example 7

Except for using a cross-linking agent (C) comprised of 30 parts of 1,6-bis(2,3-epoxy propan-1-yloxy)naphthalene (product name "HP-4032D", made by DIC, total chlorine amount 520 ppm) instead of 30 parts of epoxylated butanetetracarboxylic acid tetrakis(3-cyclohexenylmethyl)-modified ε-caprolactone in Example 6, the same procedure was followed as in Example 6 to prepare a radiation-sensitive resin composition and the same procedure was followed to measure and evaluate it. The results are shown in Table 1.

Example 8

Except for using a cross-linking agent (C) comprised of 30 parts of bisphenol F type epoxy compound (product name "jER YL983U", made by Mitsubishi Chemical, total chlorine amount 100 ppm) instead of 30 parts of epoxylated butanetetracarboxylic acid tetrakis(3-cyclohexenylmethyl)-modified ε-caprolactone in Example 6, the same procedure was followed as in Example 6 to prepare a radiation-sensitive resin composition and the same procedure was followed to measure and evaluate it. The results are shown in Table 1.

Example 9

Except for using a cross-linking agent (C) comprised of 30 parts of long chain bisphenol A type epoxy resin (product name "EXA-4816", made by DIC, total chlorine amount 1100 ppm) instead of 30 parts of epoxylated butanetetracarboxylic acid tetrakis(3-cyclohexenylmethyl)-modified ε-caprolactone and further adding a phenol resin (E) comprised of 10 parts of a novolac type phenol resin (product name "PAPS-PN2", made by Asahi Yukizai) in Example 6, the same procedure was followed as in Example 6 to prepare a radiation-sensitive resin composition and the same procedure was followed to measure and evaluate it. The results are shown in Table 1.

Example 10

Except for further adding 15 parts of hexamethoxymethylmelamine (product name "Nikalac MW-100LM", made by Sanwa Chemical) and 30 parts of aralkylphenol resin (product name "MEH-7800", made by Meiwa Plastic Industries) in Example 1, the same procedure was followed as in Example 1 to prepare a radiation-sensitive resin composition and the same procedure was followed to measure and evaluate it. The results are shown in Table 1.

Example 11

Except for further adding 30 parts of aralkylphenol resin (product name "GPH-65", made by Nippon Kayaku, compound of general formula (6) where X is represented by above formula (8)) and 1 part of γ-glycidoxypropyltrimethylsilane in Example 6, the same procedure was followed as in Example 6 to prepare a radiation-sensitive resin composition and the same procedure was followed to measure and evaluate it. The results are shown in Table 1.

Comparative Example 1

Except for using 1 part of γ-glycidoxypropyltrimethylsilane instead of a silane coupling agent (D) comprised of 1 part of N-phenyl-3-aminopropyltrimethoxysilane in Example 1, the same procedure was followed as in Example 1 to prepare a radiation-sensitive resin composition and the same procedure was followed to measure and evaluate it. The results are shown in Table 1.

Comparative Example 2

Except for using 1 part of γ-glycidoxypropyltrimethylsilane instead of a silane coupling agent (D) comprised of 1 part of N-phenyl-3-aminopropyltrimethoxysilane in Example 6, the same procedure was followed as in Example 6 to prepare a radiation-sensitive resin composition and the same procedure was followed to measure and evaluate it. The results are shown in Table 1.

Comparative Example 3

Except for using 1 part of N-2-aminoethyl-3-aminopropyltrimethoxysilane (product name "KBM-603", made by Shin-Etsu Chemical) instead of 1 part of γ-glycidoxypropyltrimethylsilane in Comparative Example 2, the same procedure was followed as in Comparative Example 2 to prepare a radiation-sensitive resin composition and the same procedure was followed to measure and evaluate it. The results are shown in Table 1.

Comparative Example 4

Except for changing the amount of the epoxylated butanetetracarboxylic acid tetrakis(3-cyclohexenylmethyl)-modified ε-caprolactone from 30 parts to 50 parts and using 1 part of 3-aminopropyltrimethoxysilane (product name "KBM-903", Shin-Etsu Chemical) instead of 1 part of γ-glycidoxypropyltrimethylsilane in Comparative Example 2, the same procedure was followed as in Comparative Example 2 to prepare a radiation-sensitive resin composition and the same procedure was followed to measure and evaluate it. The results are shown in Table 1.

As shown in Table 1, a radiation-sensitive resin composition containing a binder resin (A), radiation-sensitive compound (B), cross-linking agent (C), and the silane coupling agent (D) predetermined in the present invention was excellent in storage stability. Further, the resin film obtained by using the radiation-sensitive resin composition was excellent in adhesion in development (adhesion when forming fine patterns) and low in water absorption (Examples 1 to 11). From these results, it can be said that the resin film obtained using the radiation-sensitive resin composition of the present invention is excellent in adhesion when forming fine patterns, so when used for a resin film application for a redistribution layer formed on a surface protective film of a device forming an electronic device, a finer redistribution layer can be obtained with a high reliability.

On the other hand, when using the γ-glycidoxypropyltrimethylsilane instead of the silane coupling agent (D)

TABLE 1

| | | Example | | | | | | | |
|---|---|---|---|---|---|---|---|---|---|
| | | 1 | 2 | 3 | 4 | 5 | 6 | 7 | 8 |
| Composition of resin composition | | | | | | | | | |
| Cyclic olefin polymer (A-1) | (parts) | 100 | 100 | 100 | 100 | 100 | 100 | 100 | 100 |
| Radiation-sensitive compound (TPA520) | (parts) | 35 | 35 | 35 | 35 | 35 | 35 | 35 | 35 |
| 15-functional epoxy-based cross-linking agent (EHPE3150) | (parts) | 30 | | | | 30 | | | |
| Tetrafunctional epoxy-based cross-linking agent (GT401) | (parts) | | 50 | 50 | 50 | | 30 | | |
| Bifunctional epoxy-based cross-linking agent (HP-4032D) | (parts) | | | | | | | 30 | |
| Bifunctional epoxy-based cross-linking agent (JER YL983U) | (parts) | | | | | | | | 30 |
| Bifunctional epoxy-based cross-linking agent (EXA-4816) | (parts) | | | | | | | | |
| Methoxymethyl group-containing cross-linking agent (MW-100) | (parts) | | 10 | 10 | 10 | 15 | 15 | 15 | 15 |
| N-phenyl-3-aminopropyltrimethoxysilane | (parts) | 1 | 1 | 0.5 | 5 | 1 | 1 | 1 | 1 |
| γ-glycidoxypropyltrimethoxysilane | (parts) | | | | | 1 | | | |
| N-2-aminoethyl-3-aminopropyltrimethoxysilane | (parts) | | | | | | | | |
| 3-aminopropyltrimethoxysilane | (parts) | | | | | | | | |
| Novolac type phenol resin (PAPS-PN2) | (parts) | | | | | | | | |
| Analkylphenol resin (MEH-7800) | (parts) | | | | | | | | |
| Analkylphenol resin (GPH-65) | (parts) | | | | | | | | |
| Evaluation | | | | | | | | | |
| Storage stability | | A | A | A | A | A | A | A | A |
| Adhesion in development | | A | A | A | A | A | A | A | A |
| Amount of water absorption | (weight ppm) | 1800 | 1460 | 1480 | 1500 | 1260 | 1300 | 900 | 950 |

| | | Example | | | Comparative Examples | | | |
|---|---|---|---|---|---|---|---|---|
| | | 9 | 10 | 11 | 1 | 2 | 3 | 4 |
| Composition of resin composition | | | | | | | | |
| Cyclic olefin polymer (A-1) | (parts) | 100 | 100 | 100 | 100 | 100 | 100 | 100 |
| Radiation-sensitive compound (TPA520) | (parts) | 35 | 35 | 35 | 35 | 35 | 35 | 35 |
| 15-functional epoxy-based cross-linking agent (EHPE3150) | (parts) | | 30 | | 30 | | | |
| Tetrafunctional epoxy-based cross-linking agent (GT401) | (parts) | | | | 30 | | 30 | 30 | 50 |
| Bifunctional epoxy-based cross-linking agent (HP-4032D) | (parts) | | | | | | | |
| Bifunctional epoxy-based cross-linking agent (JER YL983U) | (parts) | | | | | | | |
| Bifunctional epoxy-based cross-linking agent (EXA-4816) | (parts) | 30 | | | | | | |
| Methoxymethyl group-containing cross-linking agent (MW-100) | (parts) | 15 | 15 | 15 | | 15 | 15 | 15 |
| N-phenyl-3-aminopropyltrimethoxysilane | (parts) | 1 | 1 | 1 | | | | |
| γ-glycidoxypropyltrimethoxysilane | (parts) | | | | 1 | 1 | 1 | |
| N-2-aminoethyl-3-aminopropyltrimethoxysilane | (parts) | | | | | | 1 | |
| 3-aminopropyltrimethoxysilane | (parts) | | | | | | | 1 |
| Novolac type phenol resin (PAPS-PN2) | (parts) | | | 10 | | | | |
| Analkylphenol resin (MEH-7800) | (parts) | | | | 30 | | | |
| Analkylphenol resin (GPH-65) | (parts) | | | | | 30 | | |
| Evaluation | | | | | | | | |
| Storage stability | | A | A | A | A | A | C | C |
| Adhesion in development | | A | A | A | C | C | — | — |
| Amount of water absorption | (weight ppm) | 1200 | 930 | 920 | 2200 | 1320 | — | — | predetermined in the present invention, the obtained resin film became inferior in adhesion in development (Comparative Examples 1 and 2).

Further, when using N-2-aminoethyl-3-aminopropyltrimethoxysilane or 3-aminopropyltrimethoxysilane instead of the silane coupling agent (D) predetermined in the present invention, the obtained radiation-sensitive resin composition was extremely inferior in storage stability and, further, when made into a resin film, suffered from remarkable peeling and could not be measured for adhesion in development and amount of water absorption (Comparative Examples 3 and 4).

The invention claimed is:

1. A radiation-sensitive resin composition comprising a cyclic olefin polymer having a protonic polar group (A), radiation-sensitive compound (B), cross-linking agent (C), and silane coupling agent (D) represented by the following general formula (1):

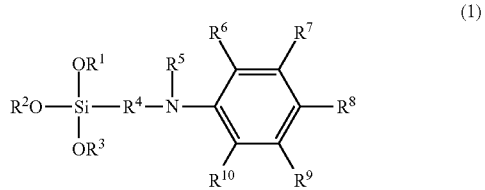

(1)

where in the general formula (1), $R^1$ to $R^3$ respectively independently are a monovalent alkyl group having 1 to 5 carbon atoms, $R^4$ is a divalent alkylene group having 1 to 10 carbon atoms, $R^5$ is a hydrogen atom or monovalent alkyl group having 1 to 5 carbon atoms, and $R^6$ to $R^{10}$ are a hydrogen atom or monovalent alkyl group having 1 to 5 carbon atoms.

2. The radiation-sensitive resin composition according to claim 1 wherein the cross-linking agent (C) includes an epoxy compound having an epoxy group.

3. The radiation-sensitive resin composition according to claim 2 wherein the total amount of chlorine of the epoxy compound is 1500 ppm or less.

4. The radiation-sensitive resin composition according to claim 2 wherein the cross-linking agent (C) further includes a compound having an alkoxyalkyl group.

5. The radiation-sensitive resin composition according to claim 1 wherein a content of the cross-linking agent (C) is 5 to 80 parts by weight with respect to 100 parts by weight of the cyclic olefin polymer having a protonic polar group (A).

6. The radiation-sensitive resin composition according to claim 1 wherein a content of the silane coupling agent (D) is 0.01 to 100 parts by weight with respect to 100 parts by weight of the cyclic olefin polymer having a protonic polar group (A).

7. The radiation-sensitive resin composition according to claim 1 further comprising a phenol resin (E).

8. An electronic device comprising a resin film containing a radiation-sensitive resin composition according to claim 1.

* * * * *